(12) United States Patent
Yamazaki

(10) Patent No.: US 7,692,378 B2
(45) Date of Patent: Apr. 6, 2010

(54) DISPLAY DEVICE INCLUDING AN INSULATING LAYER WITH AN OPENING

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1366 days.

(21) Appl. No.: 11/105,415

(22) Filed: Apr. 14, 2005

(65) Prior Publication Data

US 2005/0242713 A1 Nov. 3, 2005

(30) Foreign Application Priority Data

Apr. 28, 2004 (JP) ............... 2004-134753

(51) Int. Cl.
*H01J 1/62* (2006.01)
(52) U.S. Cl. .......................... 313/506
(58) Field of Classification Search .......... 313/506
See application file for complete search history.

(56) References Cited

U.S. PATENT DOCUMENTS

| 6,515,310 | B2 | 2/2003 | Yamazaki et al. | |
|---|---|---|---|---|
| 7,012,367 | B2 * | 3/2006 | Seki | 313/506 |
| 2002/0030193 | A1 * | 3/2002 | Yamazaki et al. | 313/503 |
| 2003/0094615 | A1 * | 5/2003 | Yamazaki et al. | 257/72 |
| 2003/0107326 | A1 * | 6/2003 | Park et al. | 315/169.3 |
| 2003/0116768 | A1 * | 6/2003 | Ishikawa | 257/79 |
| 2003/0146695 | A1 * | 8/2003 | Seki | 313/506 |
| 2003/0230972 | A1 * | 12/2003 | Cok | 313/504 |
| 2005/0264182 | A1 | 12/2005 | Seki | |

FOREIGN PATENT DOCUMENTS

| CN | 1429051 A | 7/2003 |
|---|---|---|
| JP | 2003-248440 | 9/2003 |

OTHER PUBLICATIONS

Office Action (Chinese Patent Application No. 200510068486.3) with full English translation; mailed Apr. 24, 2009 (15 pages).

* cited by examiner

*Primary Examiner*—Peter Macchiarolo
(74) *Attorney, Agent, or Firm*—Fish & Richardson P.C.

(57) ABSTRACT

When light generated in a light emitting layer of a display device is emitted through insulating films such as a planarizing film, an interlayer insulating film and a gate insulating film of a transistor, diffused reflection is caused due to slight-rough surfaces of the insulating films every time light passes through each insulating film. Accordingly, problems are caused in which stray light is caused, an outline of a pixel becomes indistinct, and a characteristic of the transistor is deteriorated. A display device according to the invention includes a transistor formed over a substrate, an insulating film with a light shielding property formed on the transistor, an opening for transmitting light therethrough formed in the insulating film with the light shielding property, and a light emitting element formed overlapping the opening.

24 Claims, 14 Drawing Sheets

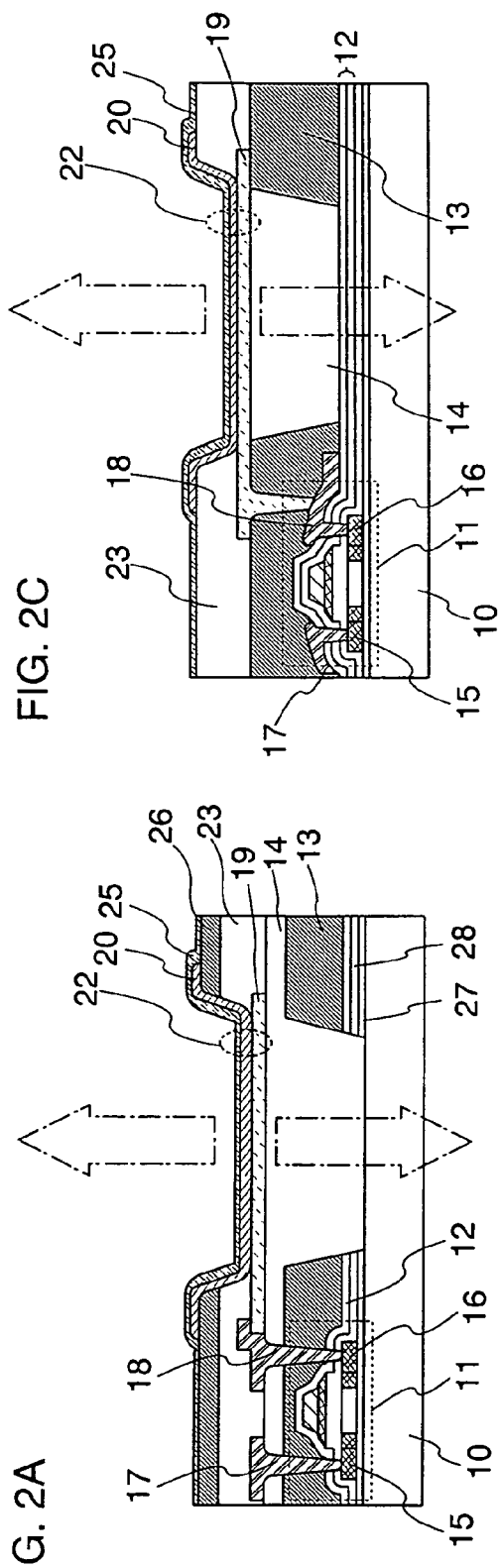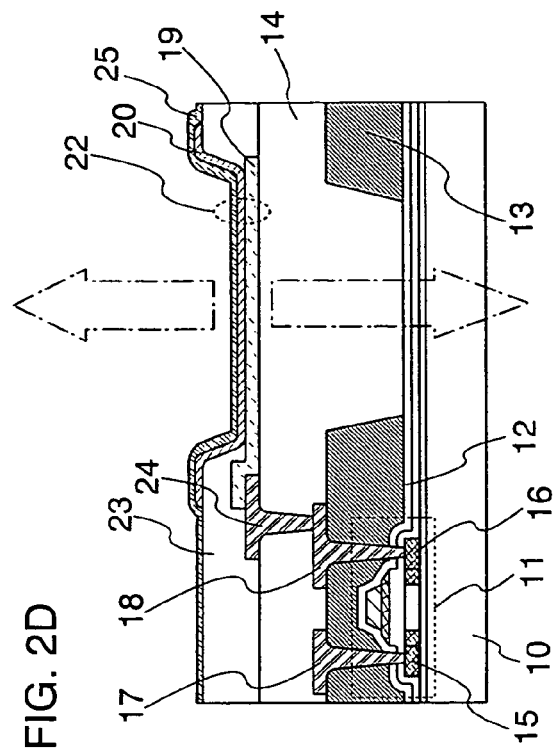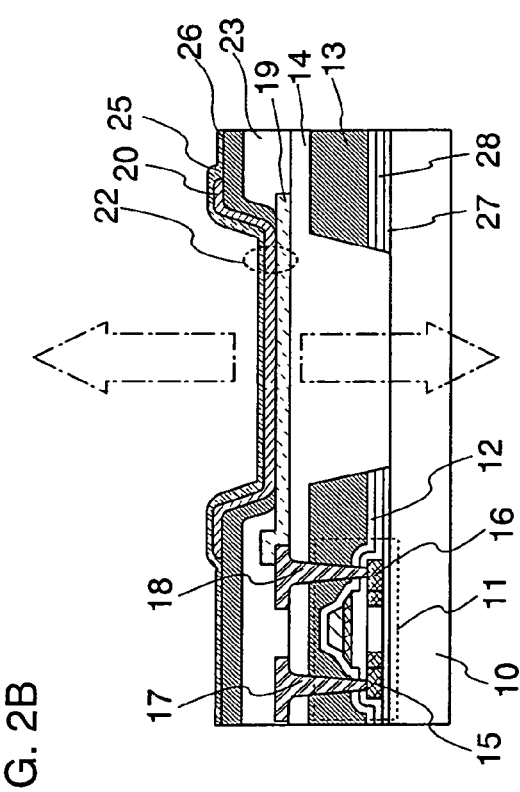

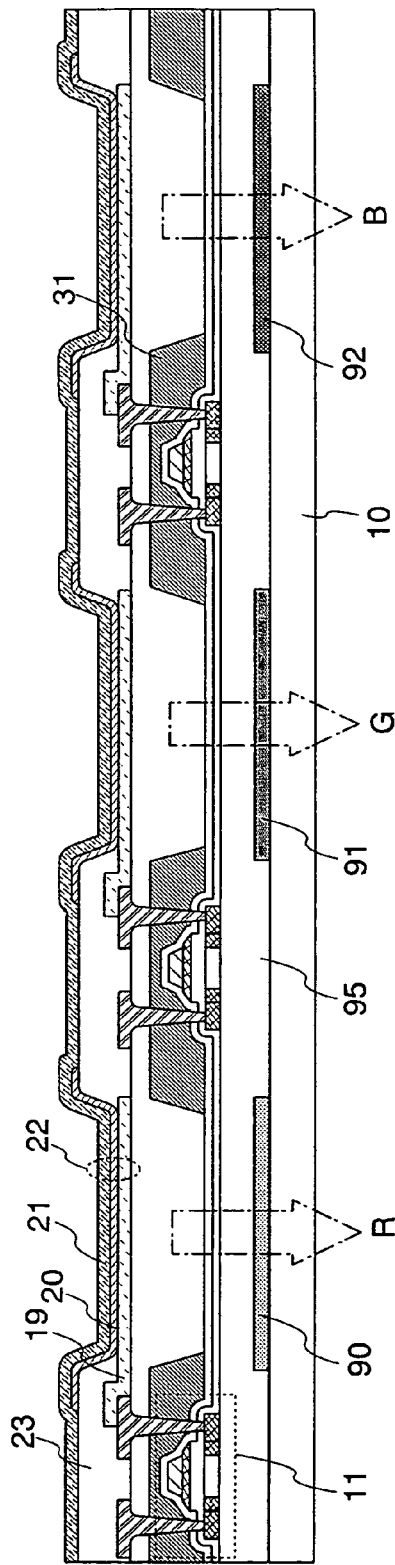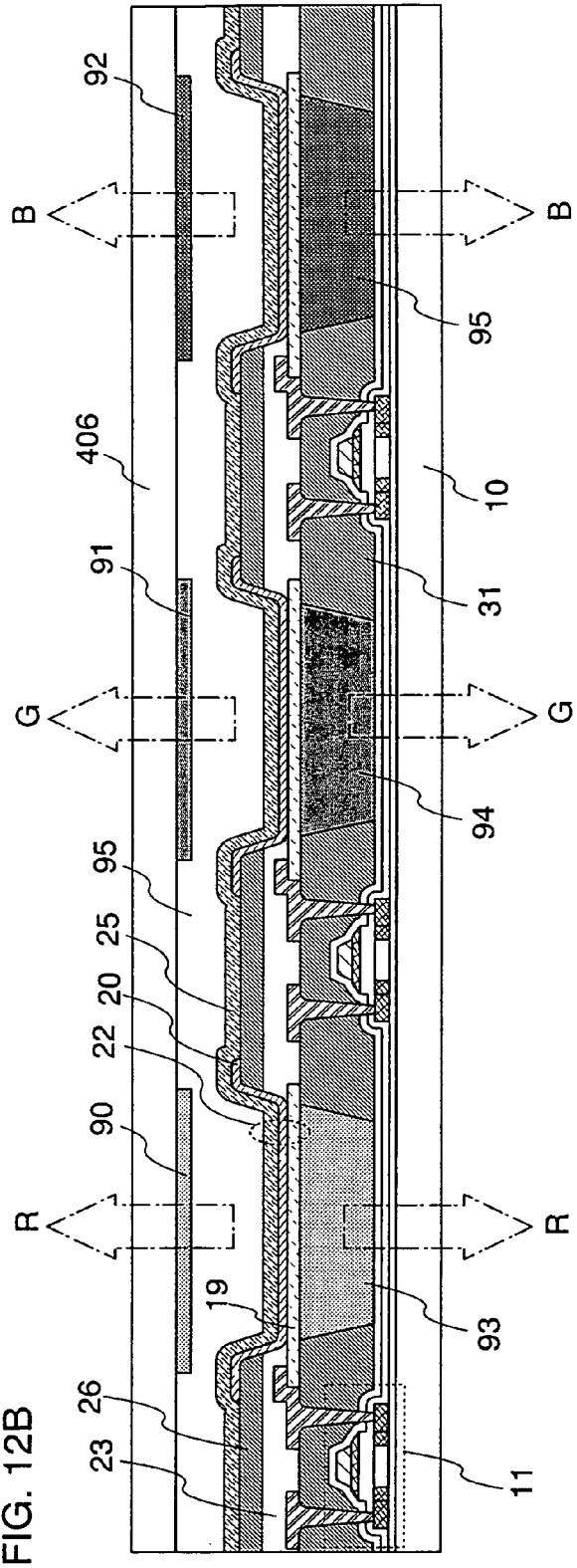

though a substrate, light passes through insulating films such as a planarizing film, an interlayer insulating film and a gate insulating film of a transistor so that the light is ultimately emitted to the outside of the substrate, as shown in the patent document 1. In this case, diffused reflection is caused due to slight-rough surfaces of the insulating films every time light passes through each insulating film, which varies a light emitting direction. Accordingly, an outline of a light emitting region corresponding to one pixel becomes indistinct since stray light is caused and light leakage is caused with respect to a non-light emitting region from the light emitting region corresponding to one pixel or characteristics of a transistor is deteriorated due to leakage of light into an active layer (a semiconductor layer) of the transistor, which results in problems.
DISPLAY DEVICE INCLUDING AN INSULATING LAYER WITH AN OPENING

BACKGROUND OF THE INVENTION

1. Field of the Invention

The present invention relates to a display device having a light emitting element.

2. Description of the Related Art

In recent years, development of a display device having a light emitting element typified by an EL (electroluminescence) element (in particular, an organic EL element) has been carried out. By utilizing benefits of high image quality, wide viewing angle, thin shape, lightweight, etc. due to self-light emitting type, widespread application of the display device having the light emitting element has been expected. The light emitting element includes a structure formed by laminating an anode, a light emitting layer and a cathode over a substrate. For example, when an anode is formed at the side of a substrate, a so-called bottom emission type display device, in which the anode is transparent and light generated from a light emitting layer is emitted toward the substrate, is known (see patent document 1).

[Patent Document] Japanese Patent Application Laid-Open No. 2003-248440

When light generated in a light emitting layer is emitted through a substrate, light passes through insulating films such as a planarizing film, an interlayer insulating film and a gate insulating film of a transistor so that the light is ultimately emitted to the outside of the substrate, as shown in the patent document 1. In this case, diffused reflection is caused due to slight-rough surfaces of the insulating films every time light passes through each insulating film, which varies a light emitting direction. Accordingly, an outline of a light emitting region corresponding to one pixel becomes indistinct since stray light is caused and light leakage is caused with respect to a non-light emitting region from the light emitting region corresponding to one pixel or characteristics of a transistor is deteriorated due to leakage of light into an active layer (a semiconductor layer) of the transistor, which results in problems.

Further, the above problems are caused in not only the bottom emission type light emitting display device, but also a so-called dual emission type display device, in which light is emitted through both a top and bottom faces of a light emitting layer.

SUMMARY OF THE INVENTION

In view of the above problems, it is an object of the present invention to provide a display device that can display high-definition images by absorbing stray light from light generated in a light emitting layer so as to suppress negative effects due to the stray light, for example, an indistinct outline of a light emitting region corresponding to one pixel.

In an aspect of the invention, a display device includes a transistor formed over a substrate, an insulating film with a light shielding property that is formed over the transistor, an opening for transmitting light therethrough that is formed in the insulating film with the light shielding property, and a light emitting element formed overlapping the opening.

Namely, in order to suppress generation of stray light emitted from a light emitting layer, the insulating film with the light shielding property is provided over the substrate to be formed with the transistor, the light emitting element and the like. Further, the opening is provided in the insulating film with the light shielding property so as to secure a path for light emitted from the light emitting layer.

In the opening provided in the insulating film with the light shielding property, an insulating film with a light transmitting property and a light emitting element may be further provided. Alternatively, the light emitting element may be directly formed inside of the opening. A most basic structure of a light emitting element is one in which an electroluminescent layer is sandwiched between a pixel electrode and a counter electrode. In this case, since the pixel electrode is connected to a transistor and light generated in the light emitting layer is emitted toward the transistor, i.e., toward the pixel electrode, the pixel electrode has a light transmitting property. This structure can prevent generation of stray light from the light emitting layer in a bottom emission type display device.

In addition, the insulating film with the light shielding property may be formed to cover the transistor. Also, an organic material or an inorganic material with a single layer or a lamination structure that functions as a barrier layer may be formed over the transistor provided over the substrate. Accordingly, deterioration of characteristics of the transistor for switching the light emitting element, supplying current, or the like can be suppressed.

In another aspect of the invention, a display device includes a transistor formed over a substrate, an insulating film with a light shielding property that is formed over the transistor, an opening for transmitting light therethrough that is formed in the insulating film with the light shielding property, a light emitting element including a pixel electrode with a light transmitting property, an electroluminescent layer and a counter electrode with a light transmitting property, that is formed overlapping the opening, and a partition wall layer including a film with a light shielding property that is provided in contact with at least any one of the pixel electrode, the electroluminescent layer and the counter electrode.

Namely, in order to prevent stray light from the light emitting layer in a dual emission type display device, the insulating film with the light shielding property is provided over a substrate to be formed with a transistor, a light emitting element and the like in a direction of downward emission and the opening is provided in the insulating film with the light shielding property so as to secure a path for light emitted from the light emitting layer. Meanwhile, in a direction of upward emission, partition wall layers including a film with a light shielding property are selectively provided and the light emitting element is formed between the partition wall layers. The partition wall layers serve to prevent stray light from light that is emitted upward (top emission) from the light emitting layer. Further, either a structure only including a film with a light shielding property or a structure including a film with a light transmitting property along with the film with the light shielding property can be employed as the partition wall layer. Of course, this structure is applicable to a top emission type display device besides the dual emission type display device.

In the opening provided in the insulating film with the light shielding property, an insulating film with a light transmitting property and a light emitting element may be provided. Alternatively, the light emitting element may be directly formed inside of the opening. A most basic structure of a light emitting element is one in which the electroluminescent layer is sandwiched between the pixel electrode and the counter electrode. In this case, since light generated in the light emitting layer is emitted toward both the pixel electrode and the counter electrode, the pixel electrode and the counter electrode have light transmitting properties. This structure can prevent generation of stray light from the light emitting layer in a dual emission type display device.

Alternatively, the insulating film with the light shielding property may be formed to cover the transistor. Also, an organic material or an inorganic material with a single layer or a lamination structure that functions as a barrier layer may be formed over the transistor that is provided over the substrate. Accordingly, deterioration of characteristics of the transistor for switching the light emitting element or supplying current can be prevented.

According to the invention, an insulating film with a light shielding property or a partition wall layer with a light shielding property is provided in a direction of light emission and an opening for transmitting light therethrough is provided therein so as to absorb and block stray light from the light emitting layer. Consequently, adverse influences such as an indistinct outline of a light emitting region corresponding to one pixel due to the stray light can be suppressed. That is, since the insulating film or the partition wall layer with the light shielding property absorbs stray light, the outline of the light emitting region corresponding to one pixel is clearly defined so that high-definition images can be displayed. The arrangement of a light shielding film can suppress the adverse influences of the stray light, thereby realizing a smaller, lighter, thinner display device. Furthermore, in the case of a bottom emission type display device, the partition wall layer is not necessary to have the light shielding property.

When the insulating film with the light shielding property is formed to cover the transistor, the deterioration of the characteristics for the transistor due to light leakage from the light emitting layer can be prevented. Additionally, when the organic or inorganic material with a single layer or a lamination structure, that serves as a barrier layer, is formed over the transistor provided over the substrate, an impurity can be prevented from being intruding through an upper portion of the transistor. Consequently, the deterioration of the characteristics for the transistor can also be prevented.

BRIEF DESCRIPTION OF DRAWINGS

FIGS. 2A to 2D are cross sectional views explaining structures of a dual emission type display device according to the invention;

FIGS. 12A and 12B are cross sectional views showing structures of display devices (including color filters) according to the invention;

DETAILED DESCRIPTION OF THE INVENTION

Figure 1A:
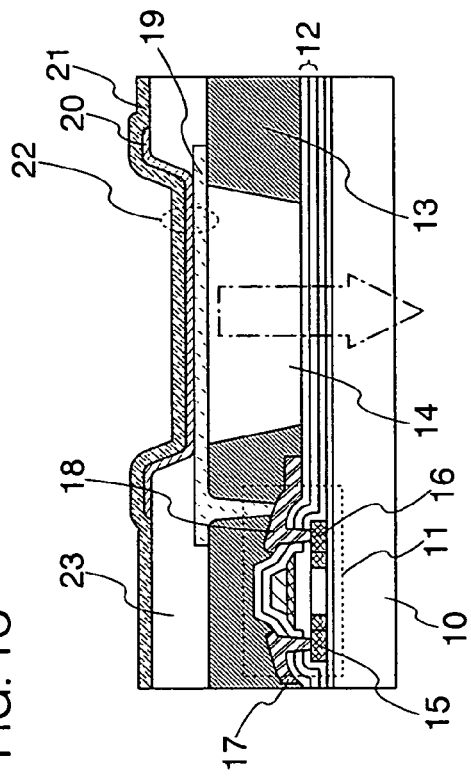
FIGS. 1A to 1D are cross sectional views explaining structures of a bottom emission type display device according to the present invention.

The embodiment modes and embodiments according to the present invention will hereinafter be described referring to the accompanying drawings. The present invention can be carried out in many different modes, and it is easily understood by those who skilled in the art that embodiment modes and details herein disclosed can be modified in various ways without departing from the purpose and the scope of the invention. The present invention should not be interpreted as being limited to the description of the embodiment modes and embodiments to be given below. For example, the invention can be implemented by combining characteristic parts of embodiment modes and embodiments below. Further, same reference numerals indicate same portions throughout the drawings.

[Embodiment Mode 1]

Cross sectional structures of bottom emission type display devices according to the invention, which are roughly classified into four cases, will be described with reference to the accompanying drawings. Further, in this embodiment mode, although a first insulating film 12 having a barrier property formed on a transistor is preferably formed as much as possible, it can be omitted. When the first insulating film 12 is omitted in one aspect of the invention, "a second insulating film 13" and "a third insulating film 14" as described later should be put into "a first insulating film 13" and "a second insulating film 14", arbitrarily.

A display device of a first structure comprises a transistor 11 including a source and drain regions 15 and 16 that is formed over a substrate 10, a first insulating film 12 formed on the transistor 11, a second insulating film 13 with a light shielding property formed on the first insulating film 12, a first opening for transmitting light therethrough that is provided in the second insulating film 13, a third insulating film 14 provided in contact with the second insulating film 13, and a light emitting element provided on the third insulating film 14 (see FIG. 1A).

The substrate 10 is a substrate having an insulated surface made from glass, quartz, plastic and the like. The transistor 11 is typically a field-effect transistor and comprises three terminals of a gate electrode, a source electrode and a drain electrode. For example, a TFT (thin film transistor) is used as the transistor 11. The conductivity type of the transistor 11 is not particularly limited, and either a p-channel type or an n-channel type may be employed. Further, the source electrode and the drain electrode are determined in accordance with each potential level of there electrodes; and therefore, the source electrode or the drain electrode is hereinafter referred to as a source/drain electrode.

The first insulating film 12 is made from an inorganic material such as a silicon oxide film, a silicon nitride film, a silicon oxynitride film and a silicon nitride oxide film. The first insulating film 12 also functions as a barrier film and prevents an impurity from intruding into the transistor 11. The first insulating film 12 is preferably formed as much as possible. The second insulating film 13 is made from an organic material as its principal constituent and has a light shielding property. With respect to a film with a light shielding property used as the second insulating film 13, carbon or a metal particle with a light shielding property is added to an organic resin material such as acrylic and polyimide or an organic material such as siloxane, and then agitated by using a shaker or an ultrasonic agitator. Subsequently, filtration is performed, if necessary. Afterwards, the resultant material is formed by spin coating. Further, siloxane mentioned in the present specification comprises a skeleton structure including silicon-oxygen bonds and comprises an organic group containing at least hydrogen (e.g., alkyl group, aromatic hydrocarbon and the like) as a substituent. Additionally, the siloxane may also comprises fluoro group as its substituent. When the carbon or metal particle is added to the organic material, a surface-active agent or a dispersing agent may be added into the organic material such that the particle and the organic material are mixed uniformly. Also, when carbon is added to the organic material, the amount of the carbon may be adjusted such that the concentration of the carbon is set to be 5 to 15 weight %. A thin film of the organic material formed by spin coating may be used as it is. In addition, the thin film may be baked to be cured. The light transmittance and the reflectance of the thin film thus formed are both 0% or approximately 0%.

In this embodiment mode, a first opening is formed in the second insulating film 13 with the light shielding property such that light generated in an electroluminescent layer, which will be formed later, passes therethrough. This first opening can be formed by etching the second insulating film 13 with use of resist or the like. Alternatively, the first opening may be formed by selectively forming the second insulting film 13 by the droplet discharging method such as the ink-jet method. The third insulating film 14 is formed on the second insulating film 13 so as to fill the first opening. The third insulating film 14 is made from a material having a light transmitting property. For example, a photosensitive or non-photosensitive organic material such as polyimide, acrylic and polyamide or heat resistant organic resin such as siloxane can be used. Although the second insulating film 13 and the third insulating film 14 both mainly contain organic resin, materials of these insulating films may be same or different from each other. Further, the materials thereof are not limited to the above-mentioned materials.

The third insulating film 14 may at least serve to fill the first opening provided in the second insulating film 13. The third insulating film 14 is not necessary to be formed on the entire surface of the second insulating film 13. In the structure as shown in FIG. 1A, the third insulating film 14 is formed on the entire surface of the second insulating film 13. When the third insulating film 14 is formed on the entire surface of the second insulating film 13 in this manner, since the third insulating film 14 has an excellent electric insulation property as compared with the second insulating film 13 containing the carbon, current supplied from the transistor 11 can be prevented from leaking into a portion other than a pixel electrode 19. Further, when the third insulating film 14 is formed only in the first opening, a planarizing treatment may be performed such that the surface of an insulating film including the second and third insulating films is planarized.

Although a lamination film including three-layered insulating films is provided in the first structure, the present invention is not limited to this structure. Alternatively, a lamination film including two insulating films or four or more insulating films may be provided. However, the lamination film is formed to include a barrier film made from an inorganic material and a film with a light shielding property made from an organic material, which has an opening. The barrier film is formed in contact with the transistor 11.

Accordingly, since the insulating film with the light shielding property (i.e., the second insulating film 13 in FIG. 1A) is provided, stray light from light generated in an electroluminescent layer 20 is shielded so as to supply uniform light to the outside. Also, the second insulating film 13 is preferably formed to cover the transistor 11, completely. This arrangement can prevent leakage of light into a semiconductor layer of the transistor 11, thereby preventing deterioration of characteristics for the transistor due to light.

Second openings are provided in the first to third insulating films and a gate insulating film of the transistor, and source/drain wirings 17 and 18 are formed therein. Accordingly, the transistor 11 and the pixel electrode 19 are connected to each other. The source/drain wirings 17 and 18 are preferably made from alloy containing aluminum and carbon. The alloy may be mixed with nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon. The resultant material has a feature of a low electric resistance value of 3.0 to 5.0 Ωcm.

In the case of using Al as the source/drain wirings, when the Al is in contact with ITO that is a pixel electrode, the Al is corroded. In this case, however, when the source/drain wirings are formed to have a lamination structure in which Al (or Al—Si alloy) is sandwiched by Ti or TiN, the source/drain wirings can be well-contacted to ITO. For example, the source/drain wirings are preferably formed by sequentially laminating Ti, Al and Ti over the substrate. However, since Al—C alloy, Al—C—Ni alloy or the like has a redox potential that is extremely approximated by that of a transparent conductive film such as ITO, the Al—C alloy or Al—C—Ni alloy can be directly contacted to ITO and the like without including a lamination structure (i.e., without sandwiching it by Ti, TiN, or the like). The source/drain wirings 17 and 18 can be formed from a target material including the above alloy by sputtering. In the case where the above-mentioned alloy is etched by using resist as a mask, wet etching is preferably performed. In this case, aluminum mixed acid, alkaline developer and the like can be used as an etchant.

Further, the source/drain wirings 17 and 18 are provided on the pixel electrode 19 or in a same layer as the pixel electrode 19. As shown in FIG. 1A, the source/drain wirings 17 and 18 are formed to cover the pixel electrode 19. Specifically, the source/drain wirings 17 and 18 are formed after forming the pixel electrode 19. Further, a wiring that connects to a source electrode of the transistor 11 is a source wiring while a wiring that connects to a drain electrode of the transistor 11 is a drain wiring. As mentioned above, since the source electrode and the drain electrode of the transistor 11 are determined according to each potential level of these electrodes, the source wiring or the drain wiring is denoted by the source/drain wiring here.

The display device having the above structure further comprises a partition wall layer 23 (also, referred to as a embankment or a bank) surrounding the edge of the pixel electrode 19; an electroluminescent layer 20 provided to be in contact with the pixel electrode 19; and a counter electrode 21 provided to be in contact with the electroluminescent layer 20. The pixel electrode 19 is made from a material with a light transmitting property here. For example, the pixel electrode 19 can be made from indium tin oxide (ITO), ITSO in which ITO is mixed with silicon oxide, zinc oxide (ZnO), zinc oxide doped with gallium (GZO), indium zinc oxide in which 2 to 20% zinc oxide is mixed with indium oxide (IZO), and the like. Also, a barrier layer made from such as silicon, silicon oxide and silicon nitride may be sandwiched between the pixel electrode 19 and the electroluminescent layer 20. This can increase the light emitting efficiency. Meanwhile, the counter electrode 21 is preferably made from a material having a light reflecting property along with a small work function. For example, Ca, Al, CaF, MgAg, AlLi, and the like can be used.

Although the shape of the side face of the partition wall layer 23 is not particularly limited, the side face thereof preferably has a sigmoid shape as shown in FIG. 1A and the like. In turn, the side face of the partition wall layer 23 preferably has an inflexion point. This can increase the coverage of the electroluminescent layer 20 and the counter electrode 21.

A light emitting element 22 may be formed by a single layer or by laminating plural layers. When the electroluminescent layer 20 includes plural layers, the electroluminescent layer may be formed by sequentially laminating, over the transistor (pixel electrode), (1) an anode, a hole injecting layer, a hole transporting layer, a light emitting layer and an electron transporting layer, a cathode; (2) an anode, a hole injecting layer, a light emitting layer and an electron transporting layer, a cathode; (3) an anode, a hole injecting layer, a hole transporting layer, a light emitting layer, an electron transporting layer and an electron injecting layer, a cathode; (4) an anode, a hole injecting layer, a hole transporting layer, a light emitting layer, a hole blocking layer and an electron transporting layer, a cathode; (5) an anode, a hole injecting layer, a hole transporting layer, a light emitting layer, a hole blocking layer, an electron transporting layer and an electron injecting layer, a cathode; and the like. These structures are referred to as so-called sequential lamination type structures, wherein the pixel electrode 19 serves as an anode (also referred to as a hole injecting electrode). On the other hand, a case where a cathode is laminated over the substrate (pixel electrode) followed by another layers is referred to as an inverted lamination type structure, wherein the pixel electrode 19 serves as a cathode (also referred to as an electron injecting electrode).

The light emitting element 22 corresponds to a lamination body including the pixel electrode 19, the electroluminescent layer 20 and the counter electrode 21. The light emitting element 22 as shown in FIG. 1A employs a sequential lamination type structure formed by sequentially laminating the pixel electrode 19 serving as an anode, the electroluminescent layer 20 and the counter electrode 21 serving as a cathode. In this case, light generated in the light emitting element 22 is emitted in a direction of the substrate 10 denoted by an arrow in FIG. 1A through the pixel electrode 19 with the light transmitting property, which serves as the anode. That is, light is emitted downward (i.e., bottom emission).

Figure 1C:
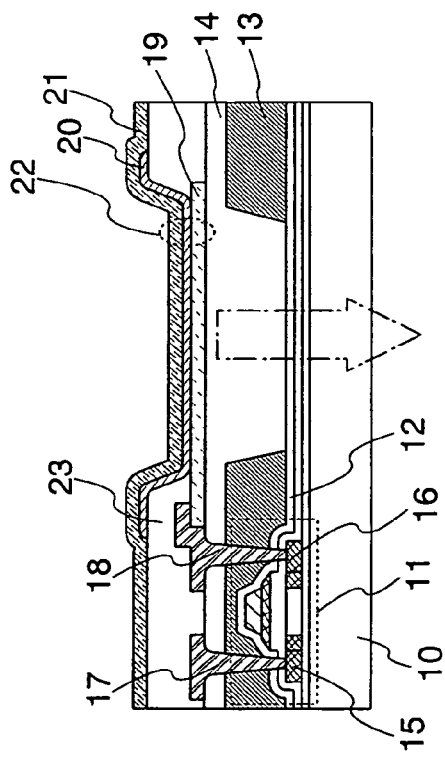
Figure 1B:
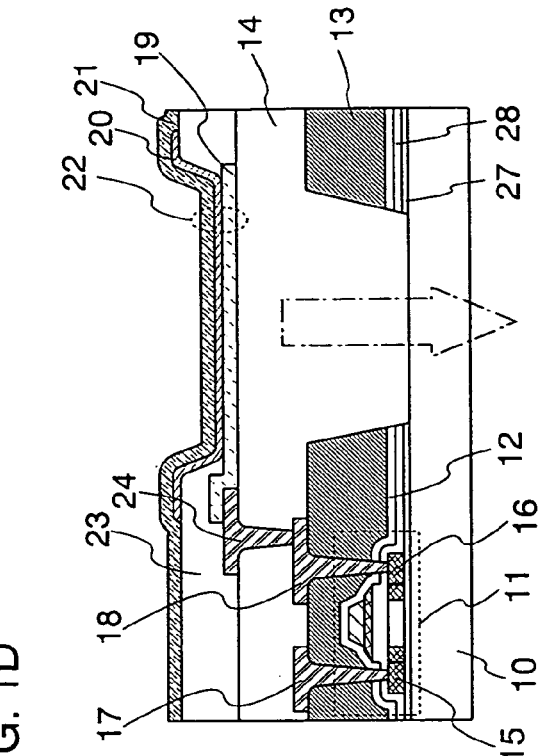

A display device of the second structure comprises a transistor 11 formed over a substrate 10; a first insulating film 12 formed on the transistor 11; a second insulating film 13 with a light shielding property formed on the first insulating film 12; a first opening for transmitting light therethrough that is provided in the second insulating film 13; a third insulating film 14 provided in contact with the second insulating film 13; and a light emitting element 22 provided on the third insulating film 14 (see FIG. 1B).

The schematic structure of the display device as shown in FIG. 1B is similar to that of the display device of the first structure. Therefore, the display device of the second structure can be formed by using the same materials as those of the display device of the first structure. However, the display device of the second structure is differed from that of the first structure in the point that the pixel electrode 19 is formed on the source/drain wiring 18. Specifically, the pixel electrode 19 is formed after forming the source/drain wirings 17 and 18.

The first opening is formed in the second insulating film 13 to transmit light from the electroluminescent layer 20. Further, a gate insulating film 28 and a base insulating film 27 of the transistor 11 may be etched by utilizing resist etc. used in etching the second insulating film 13 or the remaining second insulating film 13 as a mask. This allows emitting brighter light from the electroluminescent layer 20. Note that, the second insulating film 13, the gate insulating film 28 and the base insulating film 27 may be etched in a same step or in separate steps. As an etching gas, chlorine gas typified by $Cl_2$, $BCl_3$, $SiCl_4$ or $CCl_4$, fluorine gas typified by $CF_4$, $SF_6$, $NF_3$ or $CHF_3$, or $O_2$ can be employed. However, the present invention is not limited thereto. Furthermore, the etching can be formed by utilizing atmospheric pressure plasma.

The display device having the second structure further comprises a partition wall layer 23 surrounding the edge of the pixel electrode 19; an electroluminescent layer 20 provided to be in contact with the pixel electrode 19; and a counter electrode 21 provided to be in contact with the electroluminescent layer 20. The light emitting element 22 corresponds to a lamination body including the pixel electrode 19, the electroluminescent layer 20 and the counter electrode 21. The light emitting element 22 as shown in FIG. 1B employs a sequential lamination type structure formed by sequentially laminating the pixel electrode 19 serving as an anode, the electroluminescent layer 20 and the counter electrode 21 serving as a cathode. In this case, light generated in the light emitting element 22 is emitted toward the pixel electrode 19 serving as the anode and is emitted in a direction of the substrate 10 denoted by an arrow in FIG. 1B through the pixel electrode 19 with the light transmitting property, which serves as the anode. That is, light is emitted downward (i.e., bottom emission).

A display device of the third structure comprises a transistor 11 formed over a substrate 10; a first insulating film 12 having a lamination structure formed on the transistor 11; a second insulating film 13 with a light shielding property formed on the first insulating film 12; a first opening for transmitting light therethrough that is provided in the second insulating film 13; a third insulating film 14 provided in contact with the first opening of the second insulating film 13; and a light emitting element 22 including a pixel electrode 19 with a light transmitting property, an electroluminescent layer 20 and a counter electrode 21 that is provided on the third insulating film 14. Further, source/drain wirings 17 and 18 are formed through second openings provided in the first insulating film 12. In addition, a pixel electrode 19 is formed through a third opening provided in the second insulating film 13 (see FIG. 1C).

The first insulating film 12 has a lamination structure made from an inorganic material and serves as a barrier film. For example, the first insulating film 12 includes a lamination structure of a silicon nitride oxide film and a silicon oxynitride film. Of course, the first insulating film 12 is not limited to the lamination structure, and silicon nitride, silicon oxide and the like can also be used. Further, the first insulating film may have three or more layers. However, one layer of the laminated layers is preferably a barrier film made from an inorganic material. In particular, by using an inorganic material containing silicon nitride (including a silicon nitride oxide film and a silicon oxynitride film), it is expected that an impurity is prevented from intruding into the transistor. Further, the second insulating film 13 is made from an organic material and has a light shielding property. As a film having a light shielding property used as the second insulating film 13, an organic material such as acrylic, polyimide and siloxane, which is mixed with carbon or a metal particle with a light shielding property, can be used. Also, as the second insulating film 13, a lamination film including two or more layers may be provided. However, one layer of the lamination film should be a film with a light shielding property made from an organic material. The first opening is formed in the second insulating film 13 with the light shielding property such that light generated in the electroluminescent layer 20, which will be formed later, passes therethrough. Additionally, the third opening for forming the pixel electrode is formed in the second insulating film 13. The both the first and the third openings are preferably formed at the same time.

Further, the third insulating film 14 is formed so as to fill the first opening provided in the second insulating film 13. The third insulating film 14 is made from a material with a light transmitting property. For example, a photosensitive or nonphotosensitive organic material such as polyimide, acrylic and polyamide or heat-resistant organic resin such as siloxane can be employed. Further, the third insulating film 14 may at least serve to fill the first opening provided in the second insulating film 13; and therefore the third insulating film 14 is not necessary to be formed on the entire surface of the second insulating film 13. In FIG. 1C, the third insulating film 14 is formed only in the first opening provided in the second insulating film 13. When the third insulating film 14 is formed only in the first opening in this manner, a planarizing treatment may be separately performed such that a surface of an insulating film including the second and third insulating films is planarized.

The second openings are provided in the first to third insulating films and a gate insulating film of the transistor, so that the source/drain wirings 17 and 18 are formed therein. Accordingly, the transistor 11 and the pixel electrode 19 are connected to each other. The source/drain wirings 17 and 18 are preferably made from alloy containing aluminum and carbon. In addition, the alloy may be mixed with nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon.

Also, the pixel electrode 19 is connected to the source/drain wiring 18 through the third opening provided in the second insulating film 13. The above-described Al—C alloy, Al—C—Ni alloy and the like have a feature of an excellent light reflecting property. However, when the Al—C alloy or Al—C—Ni alloy is formed thinly so as to have a light transmitting property, the thin Al—C alloy or Al—C—Ni film can be employed as the pixel electrode 19. In this case, the pixel electrode 19 and the source/drain wirings can be made from a same material so that they are well-contacted to one another.

The display device of the third structure further comprises a partition wall layer 23 surrounding the edge of the pixel electrode 19; an electroluminescent layer 20 provided to be in contact with the pixel electrode 19; and a counter electrode 21 provided to be in contact with the electroluminescent layer 20. The light emitting element 22 corresponds to a lamination body including the pixel electrode 19, the electroluminescent layer 20 and the counter electrode 21. The light emitting element 22 as shown in FIG. 1C employs a sequential lamination type structure formed by sequentially laminating the pixel electrode 19 serving as an anode, the electroluminescent layer 20 and the counter electrode 21 serving as a cathode. In this case, light generated in the light emitting element 22 is emitted toward the pixel electrode 19 serving as the anode. That is, light is emitted downward (i.e., bottom emission).

A display device of the forth structure comprises a transistor 11 formed over a substrate 10; a first insulating film 12 formed on the transistor 11; a second insulating film 13 with a light shielding property formed on the first insulating film 12; a first opening for transmitting light therethrough that is provided in the second insulating film 13; a third insulating film 14 provided in contact with the second insulating film 13; and a light emitting element 22 including a pixel electrode 19 with a light transmitting property, an electroluminescent layer 20 and a counter electrode 22 that is provided on the third insulating film 14. Also, source/drain wirings 17 and 18 are formed through second openings provided in the first insulating film 12 and the second insulating film 13. A connection wiring 24 is formed through a third opening that is provided in the third insulating film 14, and a pixel electrode 19 is formed in contact with the connection wiring 24 (see FIG. 1D).

The first insulating film 12 is made from an inorganic material and serves as a barrier film. For example, the first insulating film 12 is made from a silicon nitride film, a silicon oxide film, a silicon nitride oxide film, a silicon oxynitride film and the like. The first insulating film 12 may have a lamination structure. In this case, one layer of the lamination film is preferably a barrier film made from an inorganic material. The second insulating film 13 is made from an organic material and has a light shielding property. The film with the light shielding property that is used for the second insulating film 13 is made from an organic material such as acrylic, polyimide and siloxane, which is mixed with carbon or a metal particle with a light shielding property. The first opening is formed in the second insulating film 13 with the light shielding property such that light generated in the electroluminescent layer 20, which will be formed later, passes therethrough. Additionally, the second openings for forming the source/drain wirings are formed in the second insulating film 13. Preferably, both the first and the second openings are formed simultaneously. As the second insulating film 13, a lamination film including two or more layers may be provided. In this case, however, one layer of the lamination film should be a film with a light shielding property that is made from an organic material.

The first opening is formed in the second insulating film 13 to transmit light from the electroluminescent layer 20. Further, a gate insulating film 28 and a base insulating film 27 of the transistor 11 may be etched by utilizing resist used in etching the second insulating film 13 or the remaining second insulating film 13 as a mask. This allows emitting brighter light from the electroluminescent layer 20. Note that, the second insulating film 13, the gate insulating film 28 and the base insulating film 27 may be etched in a same step or in separate steps.

The third insulating film 14 is formed on the source/drain wirings 17, 18 and the second insulating film 13. The third insulating film 14 is made from a material with a light transmitting property. For example, a photosensitive or nonphotosensitive organic material such as polyimide, acrylic and polyamide or heat-resistant organic resin such as siloxane can be used. The third insulating film 14 may have a lamination structure so long as it is made from the material with the light transmitting property.

The third opening is provided in the third insulating film 14 and a connection wiring 24 connecting to the source/drain wiring 18 is formed in the opening. The pixel electrode 19 is further formed on the connection wiring 24. The lamination order of the connection wiring 24 and the pixel electrode 19 is not limited to the one as shown in the drawing. The source/drain wiring 18 and the pixel electrode 19 are connected to each other through the connection wiring 24 in FIG. 1D Alternatively, the source/drain wiring 18 and the pixel electrode 19 are directly connected to each other through an opening provided in the third insulating film 14 as well as the third structure in FIG. 1C.

The source/drain wirings 17 and 18 are preferably made from alloy containing aluminum and carbon. In addition, the alloy may be mixed with nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon. Also, the connection wiring 24 can be made from the same material as the source/drain wirings.

Figure 1D:
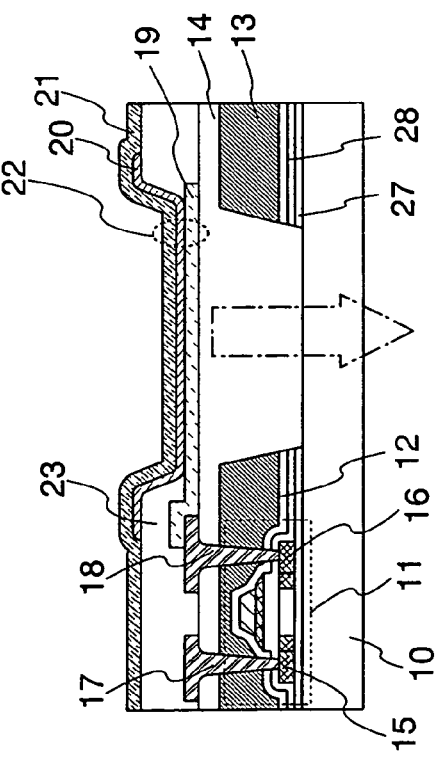

The display device of the fourth structure further comprises a partition wall layer 23 surrounding the edge of the pixel electrode 19; an electroluminescent layer 20 provided to be in contact with the pixel electrode 19; and a counter electrode 21 provided to be in contact with the electroluminescent layer 20. The light emitting element 22 corresponds to a lamination body including the pixel electrode 19, the electroluminescent layer 20 and the counter electrode 21. The light emitting element 22 as shown in FIG. 1D employs a sequential lamination type structure formed by sequentially laminating the pixel electrode 19 serving as an anode, the electroluminescent layer 20 and the counter electrode 21 serving as a cathode. In this case, light generated in the light emitting element 22 is emitted toward the pixel electrode 19 serving as the anode. That is, light is emitted downward (i.e., bottom emission).

The bottom emission type display devices having the first to fourth structure as shown in FIGS. 1A to 1D can prevent an adverse influence of an indistinct outline of a light emitting region corresponding to one pixel due to stray light by providing an insulating film with a light shielding property. That is, since the light insulating film with the light shielding property absorbs stray light, the outline of the light emitting region corresponding to one pixel is clearly defined so that high-resolution images can be displayed. In addition, the adverse influence due to stray light can be prevented by arranging a light shielding film, thereby realizing a smaller, lighter, thinner display device.

[Embodiment Mode 2]

Cross sectional structures of dual emission type display devices according to the invention, which are roughly classified into four cases, will be described with reference to the drawings. Further, in this embodiment mode, although a first insulating film 12 having a barrier property formed on a transistor is preferably formed as much as possible, it can be omitted. When the first insulating film 12 is omitted in one aspect of the invention, "a second insulating film 13" and "a third insulating film 14" as described later should be put into "a first insulating film 13" and "a second insulating film 14", arbitrarily.

A display device of a fifth structure comprises a transistor 11 formed over a substrate 10; a first insulating film 12 formed on the transistor 11; a second insulating film 13 with a light shielding property formed on the first insulating film 12; a first opening for transmitting light that is provided in the second insulating film 13; a third insulating film 14 provided in contact with the second insulating film 13; a light emitting element 22 including a pixel electrode 19 with a light transmitting property, an electroluminescent layer 20 and a counter electrode 25 with a light transmitting property, which is provided on the third insulating film 14; and a partition wall layer including a film with a light shielding property, which is provided in contact with at least one of the pixel electrode 19, the electroluminescent layer 20 and the counter electrode 25 (see FIG. 2A).

The substrate 10 is a substrate having an insulated surface made from glass, quartz, plastic and the like. The transistor 11 is typically a field-effect transistor and comprises three terminals of a gate electrode, a source electrode and a drain electrode. The conductivity type of the transistor 11 is not particularly limited, and either a p-channel type or an n-channel type may be employed.

The first insulating film 12 is made from an inorganic material such as a silicon oxide film, a silicon nitride film, a silicon oxynitride film and a silicon nitride oxide film. The first insulating film 12 also functions as a barrier film to prevent an impurity from intruding into the transistor 11. The second insulating film 13 is made from an organic material as its principal constituent and has a light shielding property. With respect to a film with a light shielding property used as the second insulating film 13, carbon or a metal particle with a light shielding property is added to an organic resin material such as acrylic and polyimide or an organic material such as siloxane, and then agitated by using a shaker or an ultrasonic agitator. Subsequently, filtration is performed, if necessary. Afterwards, the resultant material is formed by spin coating. Note that, siloxane mentioned in the present specification comprises a skeleton structure including silicon-oxygen bonds and comprises an organic group containing at least hydrogen (e.g., alkyl group, aromatic hydrocarbon and the like) as a substituent. Additionally, the siloxane may also comprises fluoro group as its substituent. When the carbon or the metal particle is added to the organic material, a surface-active agent or a dispersing agent may be added into the organic material such that these particles and the organic material are mixed uniformly. Further, when the carbon is added to the organic material, the amount of the carbon is preferably adjusted such that the concentration of the carbon is set to be 5 to 15 weight %. A thin film of the organic material formed by spin coating may be used as it is. Alternatively, the thin film may be baked to be cured. The light transmittance and the reflectance of the thin film thus formed are both 0% or approximately 0%.

A first opening is formed in the second insulating film 13 with the light shielding property such that light generated in the electroluminescent layer 20, which will be formed later, passes therethrough. This first opening can be formed by etching the second insulating film 13 with use of resist or the like. Alternatively, the first opening may be formed by selectively forming the second insulting film 13 by the droplet discharging method such as the ink-jet method.

After forming the first opening for transmitting light from the electroluminescent layer 20 therethrough in the second insulating film 13, a gate insulating film 28 and a base insulating film 27 of the transistor 11 may be further etched by utilizing resist used in etching the second insulating film 13 or the remaining second insulating film 13 as a mask. This allows emitting brighter light from the electroluminescent layer 20. Further, the second insulating film 13, the gate insulating film 28 and the base insulating film 27 may be etched in a same step or in different steps.

The third insulating film 14 is formed on the second insulating film 13 so as to fill the first opening. The third insulating film 14 is made from a material with a light transmitting property. For example, a photosensitive or nonphotosensitive organic material such as polyimide, acrylic and polyamide or heat resistant organic resin such as siloxane can be used. Although the second insulating film 13 and the third insulating film 14 both mainly contain organic resin, materials of these insulating films may be same or different from each other. Further, the materials thereof are not limited to the above-mentioned materials. The third insulating film 14 may at least serve to fill the first opening provided in the second insulating film 13. Therefore, the third insulating film 14 is not necessary to be formed on the entire surface of the second insulating film 13. In FIG. 2A, the third insulating film 14 is formed on the entire surface of the second insulating film 13. When the third insulating film 14 is formed on the entire surface of the second insulating film 13 in this manner, since the third insulating film 14 has an excellent electric insulation property as compared with the second insulating film 13 containing the carbon and the like, current supplied from the transistor 11 can be prevented from leaking into a portion other than the pixel electrode 19. Further, when the third insulating film 14 is formed only in the first opening, a planarizing treatment may be performed separately such that a surface of an insulating layer including the second and third insulating films is planarized.

Although a lamination film including three insulating films is provided in this fifth structure, the present invention is not limited to this structure. Alternatively, a lamination film including two layers or four or more layers may be provided. However, the lamination film shall include a barrier film made from an inorganic material and a film with a light shielding property made from an organic material, which has an opening. Further, the barrier film is formed in contact with the transistor 11.

Accordingly, since the insulating film with the light shielding property (i.e., the second insulating film 13 in FIG. 2A) is provided, stray light from light generated in the electroluminescent layer 20 is shielded so as to provide uniform light to the outside. Also, the second insulating film 13 is preferably formed to cover the transistor 11 completely. This arrangement can prevent leakage of light into a semiconductor layer of the transistor 11, thereby preventing deterioration of the characteristics for the transistor due to light.

Second openings are provided in the first to third insulating films and the gate insulating film of the transistor, and source/drain wirings 17 and 18 are formed therein. Accordingly, the transistor 11 and the pixel electrode 19 are connected to each other. The source/drain wirings 17 and 18 are preferably made from alloy containing aluminum and carbon. The alloy may be mixed with nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon. The source/drain wirings 17 and 18 are formed on the pixel electrode 19 or in a same layer as the pixel electrode 19. In the fifth structure as shown in FIG. 2A, the source/drain wirings 17 and 18 are formed to cover the pixel electrode 19. Specifically, the source/drain wirings 17 and 18 are formed after forming the pixel electrode 19.

The display device having the above structure further comprises a partition wall layer surrounding the edge of the pixel electrode 19; an electroluminescent layer 20 provided to be in contact with the pixel electrode 19; and a counter electrode 25 provided to be in contact with the electroluminescent layer 20. The partition wall layer is formed by laminating a partition wall layer 23 with a light transmitting property and a partition wall layer 26 with a light shielding property, here (see FIG. 2A). Note that, the lamination order of the both partition wall layers is not limited thereto. The partition wall layer 23 may also be a partition wall layer with a light shielding property. Alternatively, the partition wall layer may have only one layer of the partition wall layer 26 with the light shielding property. A third opening for forming the electroluminescent layer 20 is provided in the partition wall layers 23 and 26. This third opening can be formed by etching the partition wall layers 23 and 26 by utilizing resist or the like as a mask. Alternatively, the third opening may be formed by selectively forming the partition wall layers 23 and 26 by the droplet discharging method such as the ink-jet method.

The partition wall layer 23 with the light transmitting property can be made from a photosensitive or nonphotosensitive organic material such as polyimide, acrylic and polyamide, heat-resistant organic resin such as siloxane, or a transparent inorganic material. As the partition wall layer 26 with the light shielding property, an organic resin material such as acrylic and polyamide or an organic material such as siloxane, which is mixed with carbon or a metal particle, can be used. However, it is preferable that a partition wall layer containing the carbon or the metal particle be not formed in a portion contacting to the source/drain wirings 17, 18 and/or the pixel electrode 19 as much as possible so as to prevent current leakage. More specifically, the partition wall layer 26 with the light shielding property is preferably formed after forming an organic or inorganic material with an excellent electrical isolation property along with a light transmitting property as shown in the drawing. In either case, when using the partition wall layer 26 with the light shielding property in the dual emission type display device according to the invention, stray light from light emitted upward can be absorbed by the partition wall layer 26, thereby preventing an adverse influence of an indistinct outline between pixels, which is caused by the stray light. That is, since the partition wall layer with the light shielding property absorbs stray light, the outline between pixels is clearly defined so that high-resolution images can be displayed. In addition, the adverse influence due to stray light can be prevented by arranging a light shielding film, thereby realizing a smaller, lighter, thinner display device.

The pixel electrode 19 is made from a material with a light transmitting property here. For example, the pixel electrode 19 can be made from ITO, ITSO, ZnO, GZO, IZO and the like. Also, a barrier layer made from silicon, silicon oxide, silicon nitride or the like may be interposed between the pixel electrode 19 and the electroluminescent layer 20. This increases the light emitting efficiency. Meanwhile, the counter electrode 25 is preferably made from a thin aluminum film with a thickness of 1 to 10 nm or an aluminum film containing minute amounts of Li such that light from the light emitting layer passes through the counter electrode.

The light emitting element 22 corresponds to a lamination body including the pixel electrode 19, the electroluminescent layer 20 and the counter electrode 25. The light emitting element 22 as shown in FIG. 2A employs a sequential lamination type structure formed by sequentially laminating the pixel electrode 19 serving as an anode, the electroluminescent layer 20 and the counter electrode 25 serving as a cathode. In this case, light generated in the light emitting element 22 is emitted toward both the pixel electrode 19 and the counter electrode 25 through the both electrodes with the light transmitting properties as shown in arrows in the drawing. That is, light is emitted upward and downward (i.e., dual emission).

Further, the dual emission type display device can employ an inverted lamination type structure in which the pixel electrode 19 serves as a cathode, the counter electrode 25 serves as an anode, and the electroluminescent layer 20 is sandwiched therebetween. In this case, the pixel electrode 19 can be made from a thin aluminum film with a thickness of 1 to 10 nm or an aluminum film containing minute amounts of Li such that light from the light emitting layer passes through the pixel electrode. As the counter electrode 25, ITO, ITSO, ZnO, GZO, IZO and the like can be used. Further, the polarities of the transistor in the inverted lamination type structure may be inverted against the polarities of the transistor in the sequential lamination type structure. In the case of employing the inverted lamination type structure, since the electrodes on both sides of the electroluminescent layer 20 have the light transmitting properties, a display device capable of emitting light both upward and downward can be fabricated.

A display device of the sixth structure comprises a transistor 11 formed over a substrate 10; a first insulating film 12 formed on the transistor 11; a second insulating film 13 with a light shielding property formed on the first insulating film 12; a first opening for transmitting light that is provided in the second insulating film 13; a third insulating film 14 provided in contact with the second insulating film 13; a light emitting element 22 including a pixel electrode 19 with a light transmitting property, an electroluminescent layer 20 and a counter electrode 25 with a light transmitting property, which is provided on the third insulating film 14; and a partition wall layer containing a film with a light shielding property, which is formed in contact with at least any one of the pixel electrode 19, the electroluminescent layer 20 and the counter electrode 25 (see FIG. 2B).

The schematic structure of the display device as shown in FIG. 2B is similar to that of the display device of the fifth structure. Therefore, the display device of the sixth structure can be formed by using the same materials as the display device of the fifth structure. However, the display device of the sixth structure is differed from the display device of the fifth structure in the point that the pixel electrode 19 is formed on the source/drain wiring 18. More specifically, the pixel electrode 19 is formed after forming the source/drain wirings 17 and 18.

The display device having the sixth structure further comprises a partition wall layer 23 and a partition wall layer 26 with a light shielding property surrounding the edge of the pixel electrode 19; an electroluminescent layer 20 provided to be in contact with the pixel electrode 19; and a counter electrode 25 provided to be in contact with the electroluminescent layer 20. In this case, the partition wall layer is formed by laminating the partition wall layer 23 with a light transmitting property and a partition wall layer 26 with the light shielding property. The partition wall layer 26 with the light shielding property is formed on the side of the partition wall layer 23 in addition to the top face of the partition wall layer 23 (FIG. 2B). An example of a method for forming the sixth structure as shown in FIG. 2B will be described below. After selectively forming the partition wall layer 23 by patterning it with use of resist or by using the droplet discharging method, the partition wall layer 26 with the light shielding property is formed on the entire surface of the partition wall layer 23. Thereafter, the partition wall layer 26 with the light shielding property is patterned such that a part of the partition wall layer 26 remains on the side of the partition wall layer 23. Note that, the order of laminating the both partition wall layers is not limited to the one as shown in FIG. 2B. Further, the partition wall layer 23 may also be a partition wall layer with a light shielding property. Alternatively, the partition wall layer 26 with the light shielding property may only be formed.

The partition wall layer 23 with the light transmitting property can be made from a photosensitive or nonphotosensitive organic material such as polyimide, acrylic and polyamide, heat-resistant organic resin such as siloxane, or a transparent inorganic material. As the partition wall layer with the light shielding property, an organic resin material such as acrylic and polyimide or an organic material such as siloxane, which is mixed with carbon or a metal particle with a light shielding property, can be used. However, it is preferable that a partition wall layer containing the carbon or metal particle be not formed in a portion contacting to the source/drain wirings 17, 18 and/or the pixel electrode 19 as much as possible so as to prevent current leakage. That is, the partition wall layer 26 with the light shielding property is preferably formed after forming an organic or inorganic material with an excellent electrical isolation property along with a light transmitting property, as shown in the drawing. In either case, when using the partition wall layer 26 with the light shielding property in the dual emission type display device according to the invention, stray light from light emitted upward can be absorbed by the partition wall layer 26, thereby preventing an adverse influence of an indistinct outline between pixels. In other wards, since the partition wall layer with the light shielding property absorbs stray light, the outline between pixels clearly defined so that high-resolution images can be displayed. In addition, the adverse influence due to stray light can be prevented by arranging a light shielding film, thereby realizing a smaller, lighter, thinner display device.

The light emitting element 22 corresponds to a lamination body including the pixel electrode 19, the electroluminescent layer 20 and the counter electrode 25. The light emitting element 22 as shown in FIG. 2B employs a sequential lamination type structure formed by sequentially laminating the pixel electrode 19 serving as an anode, the electroluminescent layer 20 and the counter electrode 25 serving as a cathode. In this case, light generated in the light emitting element 22 is emitted toward both the pixel electrode 19 and the counter electrode 25 through the both electrodes with the light transmitting properties as shown in arrows in the drawing. That is, light is emitted upward and downward (i.e., dual emission).

Further, the dual emission type display device can employ an inverted lamination type structure in which the pixel electrode 19 serves as a cathode, the counter electrode 25 serves as an anode, and the electroluminescent layer 20 is interposed therebetween. In this case, the polarities of the transistor in the inverted lamination type structure may be inverted against the polarities of the transistor in the sequential lamination type structure. In the case of employing the inverted lamination type structure, since the electrodes on both sides of the electroluminescent layer 20 have the light transmitting properties, a display device capable of emitting light both upward and downward can be realized.

A display device of the seventh structure comprises a transistor 11 formed over a substrate 10; a first insulating film 12 formed on the transistor 11; a second insulating film 13 with a light shielding property formed on the first insulating film 12; a first opening for transmitting light that is provided in the second insulating film 13; a third insulating film 14 provided in contact with the first opening of the second insulating film 13; a light emitting element 22 including a pixel electrode 19 with a light transmitting property, an electroluminescent layer 20 and a counter electrode 25 with a light transmitting property, which is provided on the third insulating film 14; and a partition wall layer containing a film with a light shielding property, which is formed in contact with at least any one of the pixel electrode 19, the electroluminescent layer 20 and the counter electrode 25. Also, source/drain wirings 17 and 18 are formed through second openings provided in the first insulating film 12. In addition, the pixel electrode 19 is formed through a third opening provided in the second insulating film 13 (see FIG. 2C).

The first insulating film 12 has a lamination structure made from an inorganic material and serves as a barrier film. For example, the first insulating film 12 includes a lamination structure of a silicon nitride oxide film and a silicon oxynitride film. Of course, the first insulating film 12 is not limited to this lamination structure and silicon nitride, silicon oxide and the like can also be used. Further, the first insulating film may have three or more layers. However, one layer of the laminated film is preferably a barrier film made from an inorganic material. In particular, by using an inorganic material containing silicon nitride (including a silicon nitride oxide film and a silicon oxynitride film), it is expected that the amount of impurity intruding into the transistor be reduced. Further, the second insulating film 13 is made from an organic material and has a light shielding property. As a film having a light shielding property used as the second insulating film 13, an organic material such as acrylic, polyimide and siloxane, which is added with carbon or a metal particle with a light shielding property, can be used. Also, as the second insulating film 13, a lamination film including two or more layers may be provided. However, one layer of the lamination film should be a film with a light shielding property made from an organic material. The first opening is formed in the second insulating film 13 such that light generated in the electroluminescent layer 20 passes therethrough. Additionally, the third opening is formed in the second insulating film 13 to form the pixel electrode 19 therein. The both the first and the third openings are preferably formed at the same time. Further, the third insulating film 14 is formed so as to fill the first opening provided in the second insulating film 13. The third insulating film 14 is made from a material with a light transmitting property. For example, a photosensitive or nonphotosensitive organic material such as polyimide, acrylic and polyamide or heat-resistant organic resin such as siloxane can be employed. Further, the third insulating film 14 may serve to at least fill the first opening provided in the second insulating film 13; and therefore the third insulating film 14 is not necessary to be formed on the entire surface of the second insulating film 13. In FIG. 2C, the third insulating film 14 is formed only in the first opening provided in the second insulating film 13. When the third insulating film 14 is formed only in the first opening in this manner, a planarizing treatment may be separately performed such that a surface of an insulating film including the second and third insulating films is planarized.

The source/drain wirings 17 and 18 are preferably made from alloy containing aluminum and carbon. In addition, the alloy may be mixed with nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon.

The display device of the seventh structure further comprises a partition wall layer 23 surrounding the edge of the pixel electrode 19; an electroluminescent layer 20 provided to be in contact with the pixel electrode 19; and a counter electrode 25 provided to be in contact with the electroluminescent layer 20. The light emitting element 22 corresponds to a lamination body including the pixel electrode 19, the electroluminescent layer 20 and the counter electrode 25. The light emitting element 22 as shown in FIG. 2C employs a sequential lamination type structure formed by sequentially laminating the pixel electrode 19 serving as an anode, the electroluminescent layer 20 and the counter electrode 25 serving as a cathode. In this case, light generated in the light emitting element 22 is emitted toward both the pixel electrode 19 and the counter electrode 25 through the both electrodes with the light transmitting properties as shown in arrows in the drawing. That is, light is emitted upward and downward (i.e., dual emission). Further, although only the partition wall layer 23 made from a transparent organic material is provided in the seventh structure in FIG. 2C, a partition wall layer with a lamination structure, which includes the transparent organic material and organic resin with a light shielding property, may be formed as well as the fifth and sixth structures.

Further, the dual emission type display device can employ an inverted lamination type structure in which the pixel electrode 19 serves as a cathode, the counter electrode 25 serves as an anode, and the electroluminescent layer 20 is interposed therebetween. In this case, the polarities of the transistor in the inverted lamination type structure may be inverted against the polarities of the transistor in the sequential lamination type structure. In the case of employing the inverted lamination type structure, since the electrodes on both sides of the electroluminescent layer 20 have the light transmitting properties, a display device capable of emitting light both upward and downward can be realized.

A display device of the eighth structure comprises a transistor 11 formed over a substrate 10; a first insulating film 12 formed on the transistor 11; a second insulating film 13 with a light shielding property formed on the first insulating film 12; a first opening for transmitting light therethrough that is provided in the second insulating film 13; a third insulating film 14 provided in contact with the second insulating film 13; a light emitting element 22 including a pixel electrode 19 with a light transmitting property, an electroluminescent layer 20 and a counter electrode 25 with a light transmitting property, which is provided on the third insulating film 14; and a partition wall layer containing a film with a light shielding property, which is formed in contact with at least any one of the pixel electrode 19, the electroluminescent layer 20 and the counter electrode 25. Also, source/drain wirings 17 and 18 are formed through second openings provided in the first insulating film 12 and the second insulating film 13. In addition, a connection wiring 24 is formed through a third opening provided in the third insulating film 14, and a pixel electrode 19 is formed in contact with the connection wiring 24 (see FIG. 2D).

The first insulating film 12 is made from an inorganic material and serves as a barrier film. For example, the first insulating film 12 is made from a silicon nitride film, a silicon oxide film, a silicon nitride oxide film, a silicon oxynitride film and the like. The first insulating film 12 may have a lamination structure. In this case, one layer of the lamination film is preferably a barrier film made from an inorganic material. The second insulating film 13 is made from an organic material and has a light shielding property. As the second insulating film 13, a lamination film including two or more layers may be provided. In this case, however, one layer of the lamination film should be a film with a light shielding property that is made from an organic material. The film with the light shielding property that is used for the second insulating film 13 is made from an organic material such as acrylic, polyimide and siloxane, which is mixed with carbon or a metal particle with a light shielding property. The first opening is formed in the second insulating film 13 with the light shielding property such that light generated in the electroluminescent layer 20 passes through the second insulating film 13. Additionally, the second openings are formed in the second insulating film 13 so that the source/drain wirings are formed therein. Preferably, both the first and the second openings are formed simultaneously. Further, a lamination film including two or more layers may be provided as the second insulating film 13. However, one layer of the lamination film should be a film with a light shielding property, which is made from an organic material. The third insulating film 14 is formed on the source/drain wirings 17, 18 and the second insulating film 13. The third insulating film 14 is made from a material with a light transmitting property. For example, a photosensitive or nonphotosensitive organic material such as polyimide, acrylic and polyamide or heat-resistant organic resin such as siloxane can be used. The third insulating film 14 may have a lamination structure as long as it is made from the material with the light transmitting property.

The third opening is formed in the third insulating film 14 and the connection wiring 24 connecting to the source/drain wiring 18 is formed in the third opening. Further, the pixel electrode 19 is formed on the connection wiring 24. The lamination order of the connection wiring 24 and the pixel electrode 19 is not limited to the one as shown in FIG. 2D. Also, in FIG. 2D, the source/drain wiring 18 and the pixel electrode 19 are connected to each other through the connection wiring 24. However, the source/drain wiring 18 and the pixel electrode 19 may be connected to each other directly through the third opening provided in the third insulating film 14 as well as the third structure in FIG. 1C.

The source/drain wirings 17 and 18 are preferably made from alloy containing aluminum and carbon. In addition, the alloy may be mixed with nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon. Also, the connection wiring 24 can be made from the same materials as the source/drain wirings.

The display device of the eighth structure further comprises a partition wall layer 23 surrounding the edge of the pixel electrode 19; an electroluminescent layer 20 provided to be in contact with the pixel electrode 19; and a counter electrode 25 provided to be in contact with the electroluminescent layer 20. The light emitting element 22 corresponds to a lamination body including the pixel electrode 19, the electroluminescent layer 20 and the counter electrode 25. The light emitting element 22 as shown in FIG. 2D employs a sequential lamination type structure formed by sequentially laminating the pixel electrode 19 serving as an anode, the electroluminescent layer 20 and the counter electrode 25 serving as a cathode. In this case, light generated in the light emitting element 22 is emitted toward both the pixel electrode 19 and the counter electrode 25 through the both electrodes with the light transmitting properties as shown in arrows in the drawing. That is, light is emitted both upward and downward (i.e., dual emission). Further, although only the partition wall layer 23 made from a transparent organic material is provided in the eighth structure in FIG. 2D, a partition wall layer with a lamination structure, which includes the transparent organic material and organic resin with a light shielding property, may be formed as well as the fifth and sixth structures.

Further, the dual emission type display device can employ an inverted lamination type structure in which the pixel electrode 19 serves as a cathode, the counter electrode 25 serves as an anode, and the electroluminescent layer 20 is interposed therebetween. In this case, the polarities of the transistor in the inverted lamination type structure may be inverted against the polarities of the transistor in the sequential lamination type structure. In the case of employing the inverted lamination type structure, since the electrodes on both sides of the electroluminescent layer 20 have the light transmitting properties, a display device capable of emitting light both upward and downward can be realized.

With respect to the above-mentioned seventh structure (see FIG. 2C), the first insulating film 12 is formed on the transistor 11, the second insulating film 13 is formed on the first insulating film 12, the third insulating film 14 is formed in contact with the second insulating film 13, and the pixel electrode 19 contacting to the source/drain wiring 18 through the third opening, which is provided in the second insulating film 13, is formed. Also, with respect to the eighth structure (see FIG. 2D), the first insulating film 12 is formed on the transistor 11, the second insulating film 13 is formed on the first insulating film 12, the third insulating film 14 is formed on the second insulating film 13, the connection wiring 24 contacting to the source/drain wiring 18 is formed through the third opening, which is provided in the third insulating film 14, and the pixel electrode 19 contacting to the connection wiring 24 is formed. Alternatively, the pixel electrode 19 that is directly in contact with the source/drain wiring 18 through the third opening provided in the third insulating film 14 is formed, without forming the connection wiring 24. According to these structures, a region to be provided with the pixel electrode 19 is not limited to a region in which the source/drain wirings 17 and 18 are arranged. That is, a margin of the region to be provided with the pixel electrode 19 is increased so that an aperture ratio of the top emission among the both emission can be especially increased. Furthermore, the high aperture ratio can reduce a driving voltage and power consumption, with the increase in area where emits light.

Since the insulating film with the light shielding property is provided at least at the side through which light is emitted downward, the dual emission type display devices having the fifth to eighth structures as shown in FIGS. 2A to 2D can suppress adverse influence of an indistinct outline between pixels due to stray light. More specifically, since the insulating film with the light shielding property absorbs stray light, the outline between the pixels is clearly defined, thereby displaying high-resolution images. Of course, in each of the dual emission type display devices according to the invention, an insulating film with a light shielding property (which is the partition wall layer 26 here) is preferably provided at the side through which light is emitted upward so as to shield stray light. This structure can, of course, be applied to a top emission type display device besides the dual emission type display devices. In this case, a silicon substrate or a metal substrate can be employed as the substrate 10 in addition to a substrate with an insulated surface made from glass, quartz, plastic, and the like, as described above. According to the present invention, the adverse influence due to stray light can be suppressed by providing a light shielding film, thereby realizing a smaller, lighter, thinner display device.

[Embodiment 1]

A structure of a display device according to the invention will be described with reference to FIGS. 3A and 3B. A display device of the invention comprises a plurality of pixels 310 each includes a plurality of elements in a region where a source line Sx (x is a natural number, which satisfies $1 \leq x \leq m$) intersects with a gate line Gy (y is a natural number, which satisfies $1 \leq y \leq n$) through an insulating material (see FIG. 3A). Each pixel 310 includes a light emitting element 313, a capacitor element 316 and two transistors. One of the two transistors is a switching transistor 311 for controlling input of a video signal to the pixel 310 while the other one is a driving transistor 312 for controlling switching ON/OFF of the light emitting element 313. The capacitor element 316 has a function of holding a gate-source voltage of the transistor 312. Further, the capacitor element 316 can be eliminated. More specifically, a gate capacitance of the transistor 312 can substitute for the capacitor element 316. The gate capacitance of the transistor 312 may be formed in a region in which a gate electrode is overlapped with a source region, a drain region, an LDD region and the like. Alternatively, the gate capacitance may be formed between a channel region and a gate electrode.

A gate electrode of the transistor 311 is connected to the gate line Gy. One of source and drain electrodes of the transistor 311 is connected to the source line Sx while the other one is connected to a gate electrode of the transistor 312. One of source and drain electrodes of the transistor 312 is connected to a first power source 317 through a power supply line Vx (x is a natural number, which satisfies $1 \leq x \leq 1$) while the other one is connected to a pixel electrode of the light emitting element 313. A counter electrode of the light emitting element 313 is connected to a second power source 318. The capacitor element 316 is arranged between the gate and source electrodes of the transistor 312. The conductivity types of the transistors 311 and 312 may be either an n-type or p-type. FIG. 3A illustrates a case in which the transistor 311 has an n-type conductivity and the transistor 312 has a p-type conductivity. The potentials of the first power source 317 and the second power source 318 are not particularly limited. However, the potentials thereof are set to be different from each other such that a forward bias voltage or a reverse bias voltage is applied to the light emitting element 313.

A semiconductor including the transistors 311 and 312 may be any one of an amorphous semiconductor (amorphous silicon), a microcrystalline semiconductor, a crystalline semiconductor, an organic semiconductor and the like. The microcrystalline semiconductor may be formed by using silane gas ($SiH_4$) and fluorine gas ($F_2$), or by using silane gas and hydrogen gas. Alternatively, a thin film may be formed by using the above-mentioned gases and then be irradiated with laser beam to form the microcrystalline semiconductor. The gate electrodes of the transistors 311 and 312 are formed to have a single layer or a lamination layer by using a conductive material. For example, a structure formed by sequentially laminating tungsten (W) and tungsten nitride (WN) over a substrate over which the pixel 310 is formed, a structure formed by sequentially laminating molybdenum (Mo), aluminum (Al) and Mo over the substrate, or a structure formed by sequentially laminating Mo and molybdenum nitride (MoN) thereover may be employed.

Figure 4:
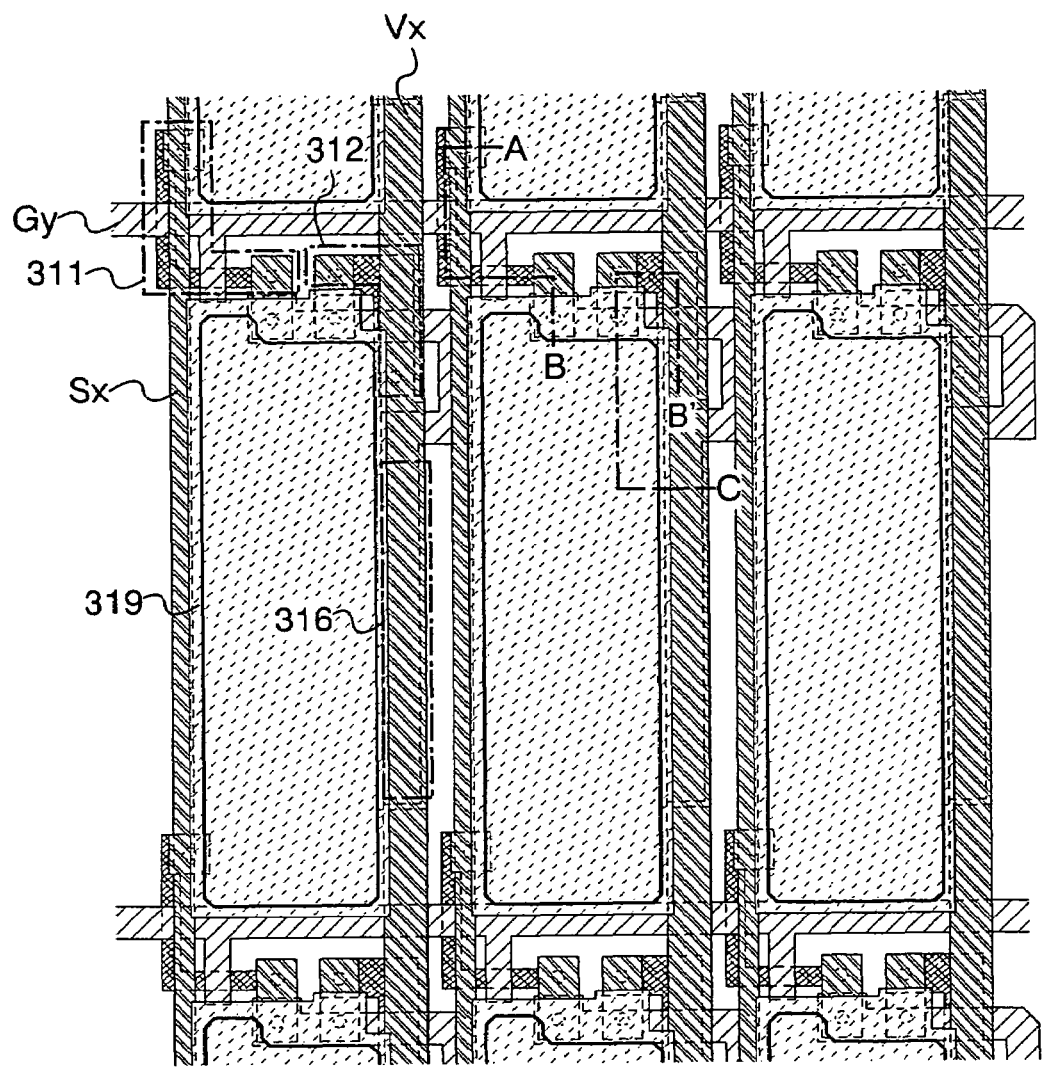
FIG. 4 is a top view of a pixel region for a display device according to the invention.

A layout of the pixels 310 having the above structure is shown in FIG. 4. In this layout, the transistors 311 and 312, the capacitor element 316 and the pixel electrode 319 of the light emitting element 313 are illustrated.

Subsequently, a cross sectional structure corresponding to a chained line A-B, B'-C of the layout will be shown in FIG. 3B. The transistors 311 and 312, the light emitting element 313 and the capacitor element 316 are provided over a substrate 320 with an insulated surface, which is made from glass, quartz or the like. A glass substrate, a quartz substrate, a substrate made from an insulating material such as alumina, a heat-resistant plastic substrate that can withstand a processing temperature in a subsequent step, and the like can be used as the substrate 320. As shown in FIGS. 1A to 1D and FIGS. 2A to 2D, a base insulating film 27 may be formed over the substrate in advance.

Figure 5:
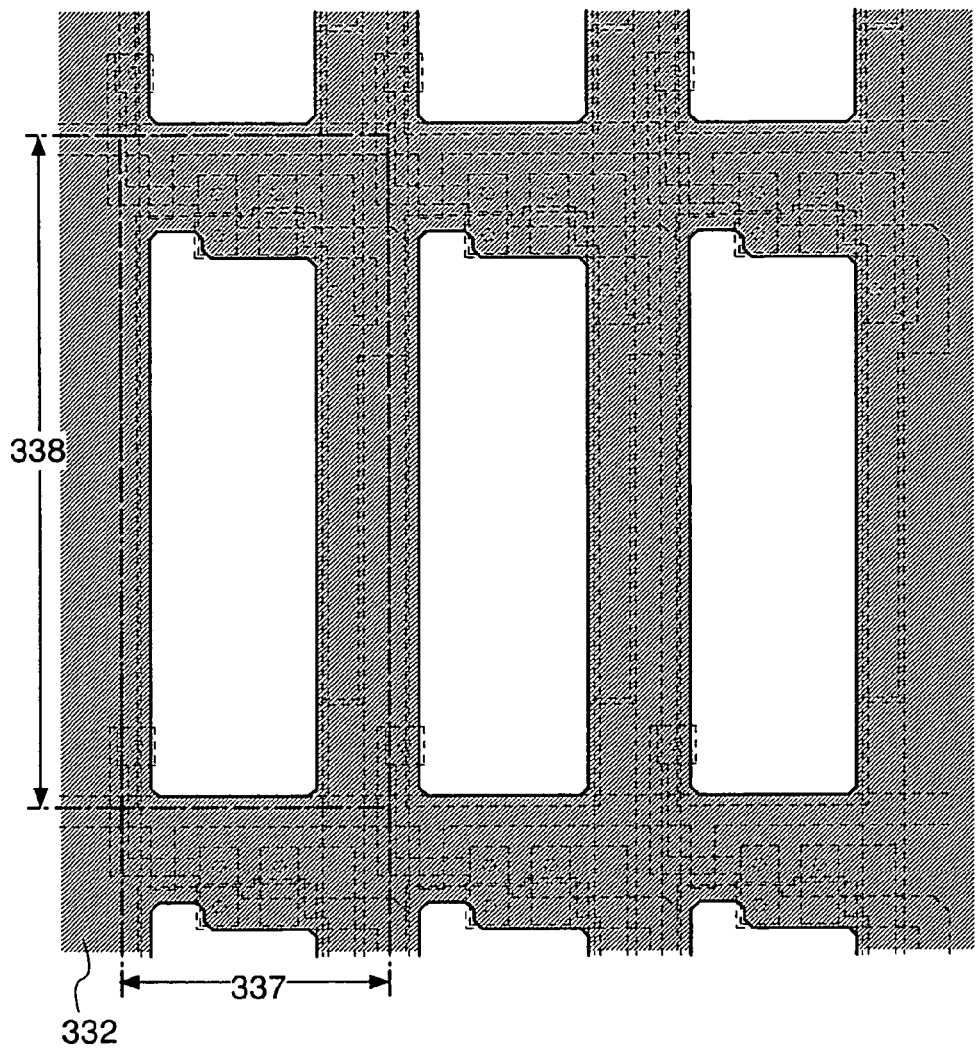
FIG. 5 is a top view of a pixel region for a display device according to the invention (a layout chart of a partition wall layer)

Further, a layout of a partition wall layer 332 provided between the adjacent pixels 310 will be shown in FIG. 5. The width of the partition wall layer 332 is preferably set such that the partition wall layer can mask underlying wirings. The length in the column direction (longitudinal length) of each pixel 310 in FIG. 5 is denoted by reference numeral 338 while the length in the row direction (horizontal length) thereof is denoted by reference numeral 337.

Figure 3A:
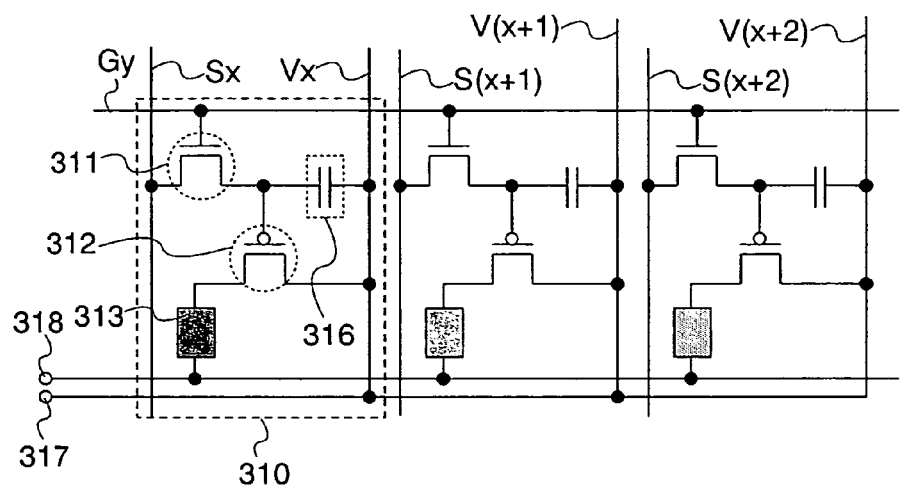
FIG. 3A is an equivalent circuit diagram of a pixel region for a display device according to the invention and FIG. 3B is a cross sectional view thereof.
Figure 3B:
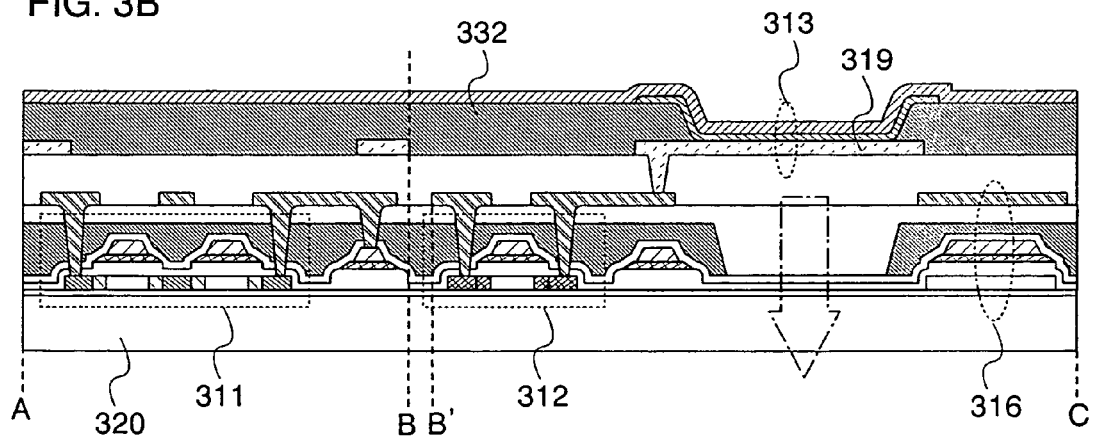
Figure 6A:
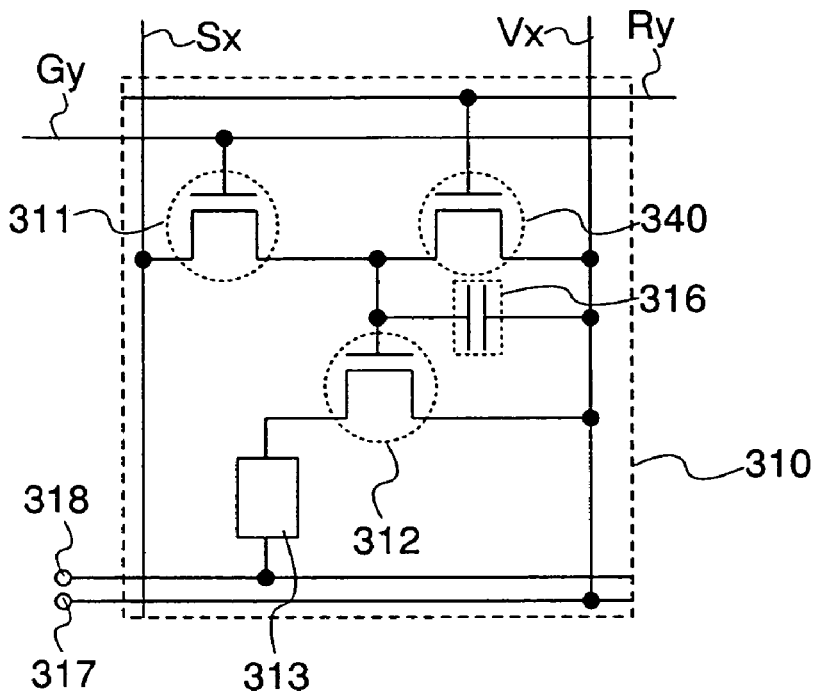
FIGS. 6A and 6B are equivalent circuit diagrams of a pixel region for a display device according to the invention.

Next, examples of pixel circuits applicable to the present invention will be described with reference to the drawings except for the pixel circuit as shown in FIG. 3A. FIG. 6A illustrates a pixel circuit, wherein an erasing transistor 340 and an erasing gate line Ry are newly added to the pixel 310 as shown in FIG. 3A. The supply of current through the light emitting element 313 can be forcibly stopped by providing the erasing transistor 340. Therefore, a lighting period can start simultaneously with or immediately after a wiring period stars before a signal is written in all pixels. Consequently, the duty ratio can be improved so that moving images can especially be displayed.

Figure 6B:
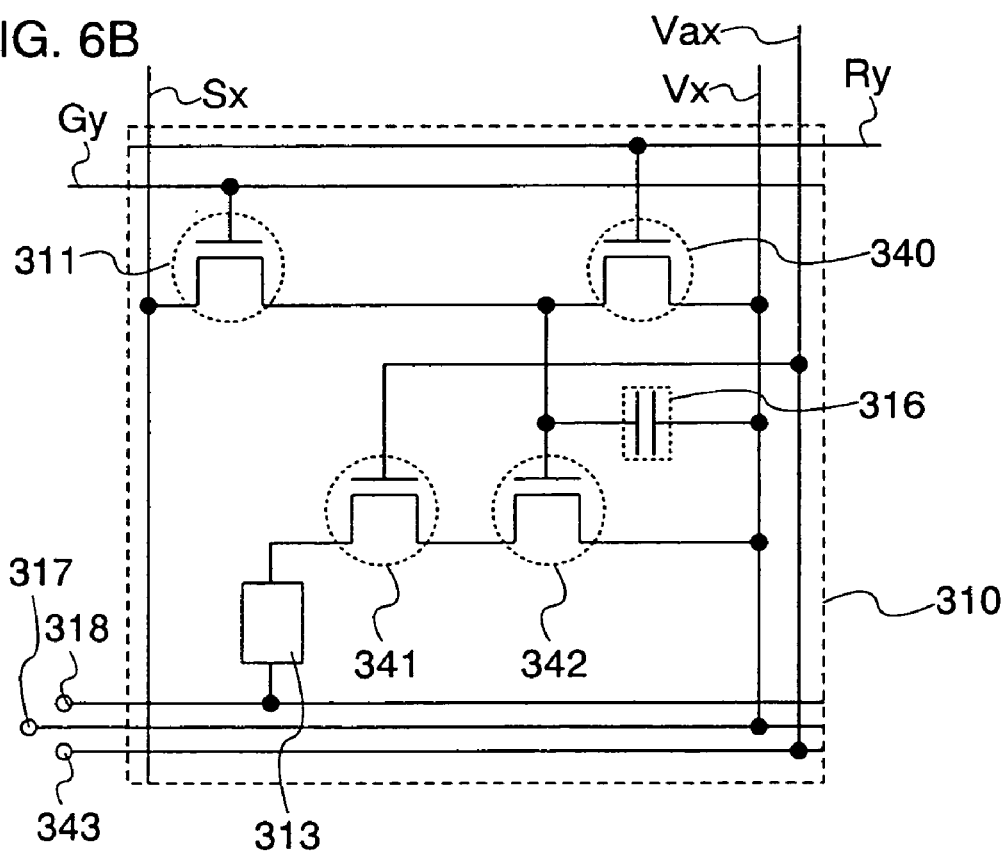

FIG. 6B is a pixel circuit in which transistors 341, 342 and a power supply line Vax (x is a natural number, which satisfies $1 \leq x \leq 1$) are newly added to the pixel 310 as shown in FIG. 3A, though the transistor 312 is removed. The power supply line Vax is connected to a power source 343. In this configuration, by connecting a gate electrode of the transistor 341 to the power supply line Vax maintaining at a constant potential, the potential of the gate electrode of the transistor 341 is fixed and the transistor 341 is operated in a saturation region. Further, the transistor 342 is operated in a linear region and a video signal including information about lighting/non-lighting of the pixel is input in a gate electrode of the transistor 342. Since the value of the source-drain voltage of the transistor 342 operated in the linear region is low, the slight variation in gate-source voltage of the transistor 342 does not adversely affect the amount of current flowing through the light emitting element 313. Therefore, the amount of current flowing through the light emitting element 313 is determined by the transistor 341 operated in the saturation region. The present invention having the above configuration can improve luminance fluctuation of the light emitting element 313, which is caused by variations in characteristic of the transistor 341, thereby improving the image quality. The present embodiment can be freely combined with the above embodiment modes and other embodiments.

[Embodiment 2]

A panel that is one mode of a display device according to the invention will be described. A display region 400 with a plurality of pixels each including a light emitting element, a gate driver 401, a gate driver 402, a source driver 403, and a connection film 407 such as an FPC are provided over a substrate 405 (see FIG. 7A). The connection film 407 is connected to an IC chip or the like.

Figure 7A:
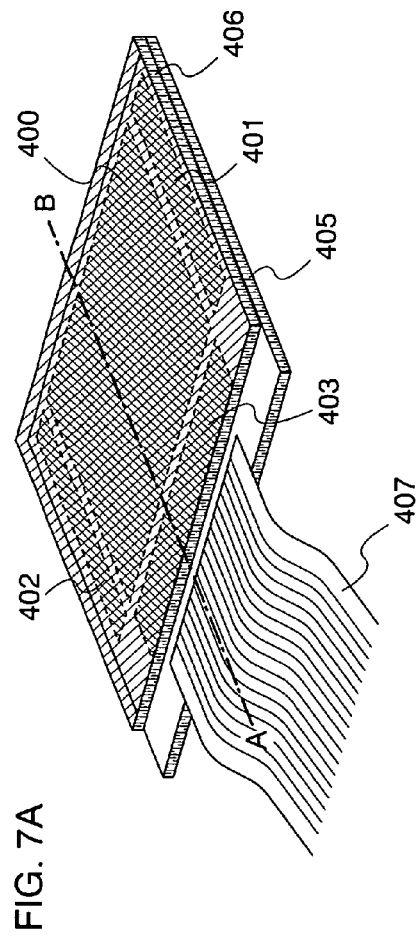
FIG. 7A is a top view of a display device according to the invention and FIG. 7B is a cross sectional view thereof.
Figure 7B:
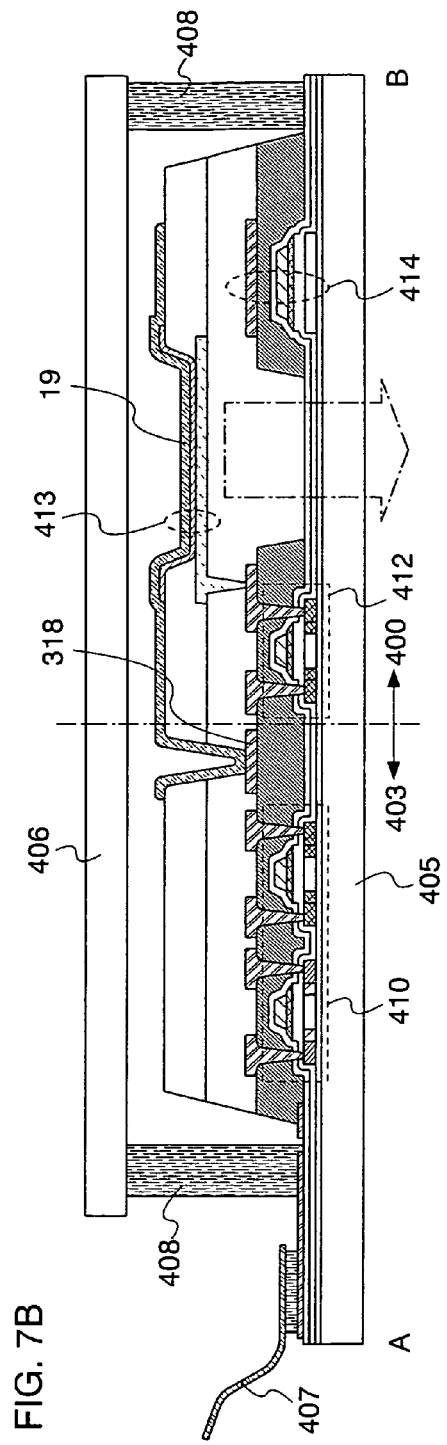

FIG. 7B shows a cross sectional view taking along a line A-B of FIG. 7A, wherein a transistor 412 and a light emitting element 413 are provided in the display region 400 and an element group 410 is provided in the source driver 403. Reference numeral 414 denotes a capacitor element. A sealing material 408 is provided around the display region 400, the gate drivers 401, 402 and the source driver 403. The light emitting element 413 is sealed with the sealing material 408 and a counter substrate 406. This sealing treatment is carried out to protect the light emitting element 413 from moisture. In this embodiment, a method for sealing the light emitting element 413 with a cover member (such as glass, ceramic, plastic and metal) is employed. Alternatively, a method for sealing it with heat curing resin or ultraviolet curing resin or a method for sealing it with a thin film with an excellent barrier property such as metal oxide and nitride may be employed. A counter electrode 19 of the light emitting element 413 is connected to the second power source 318 in the case of Embodiment 1. The elements formed over the substrate 405 are preferably formed by using a crystalline semiconductor (polysilicon) with excellent characteristics such as the mobility as compared with an amorphous semiconductor so that the elements are monolithically integrated over the same surface. The number of external ICs connected to the panel having the above structure is reduced, and hence, the panel can be made smaller, lighter and thinner.

Also, the display region 400 may be formed by using a transistor that employs an amorphous semiconductor formed on an insulated surface as a channel portion while the gate drivers 401, 402 and the source driver 403 may be formed by using IC chips. The IC chips may be attached to the surface of the substrate 405 by the COG method or attached to the connection film 407 connecting to the substrate 405. The amorphous semiconductor can be easily formed over a large size substrate by CVD without performing a crystallization step; and therefore, an inexpensive panel can be provided. In this case, when a conductive layer is formed by the droplet discharging method typified by the ink-jet method, a more inexpensive panel can be provided.

Figure 13:
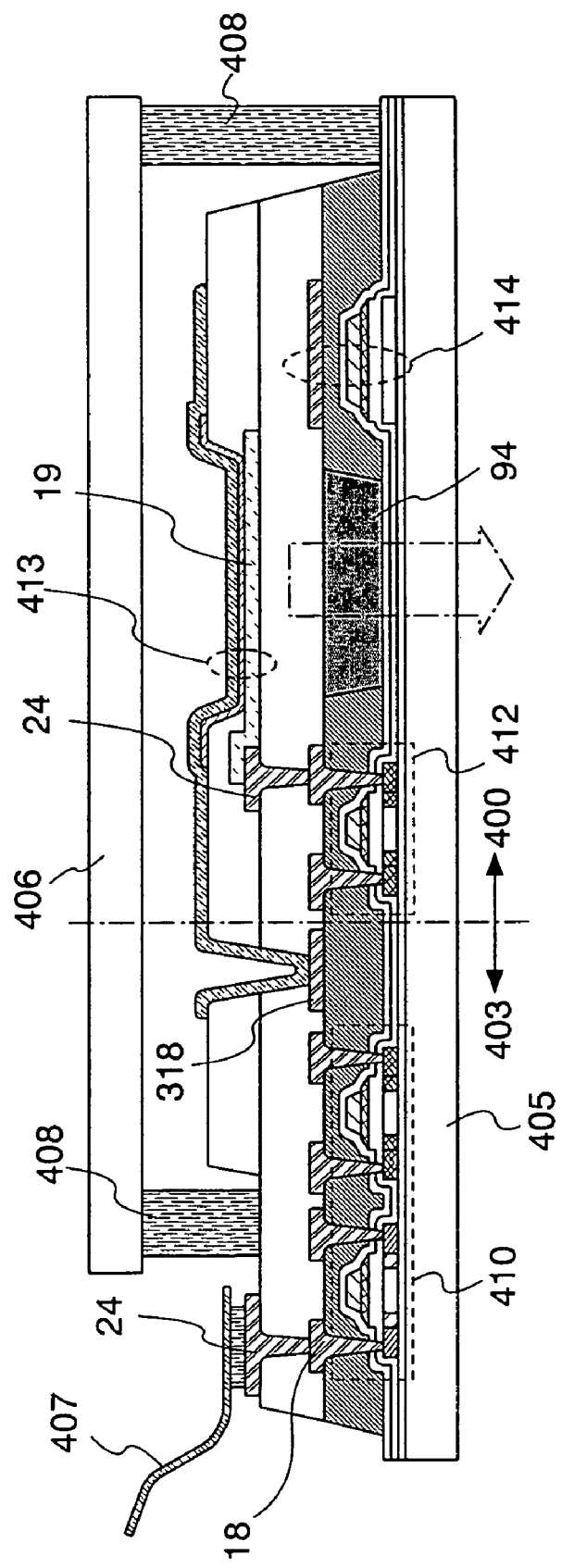
FIG. 13 is a cross sectional view showing a structure of a display device (including an FPC) according to the invention.

Further, a position of the connection film 407 is not limited to the above structure. For instance, the connection film 407 may be formed over an insulating film with a light transmitting property or a light shielding property as shown in FIG. 13. In this case, the connection film 407 and the element group 410 are connected to each other through a connection wiring 24 and a source/drain wiring 18. Furthermore, the present embodiment can be freely combined with the above embodiment modes and other embodiments.

[Embodiment 3]

As electronic appliances each uses a display device with a pixel region having a light emitting element, a television device (e.g., a television and a television receiver); a camera such as a video camera and a digital camera; a mobile phone unit (e.g., a cellular phone); a portable information terminal such as a PDA; a portable game machine, a monitor, a computer, an audio reproduction device such as a car audio; an image reproduction device provided with a recording medium such as a home-use game machine; and the like can be cited. Specific examples of the electronic appliances are described in FIGS. 8A to 8F.

Figure 8A:
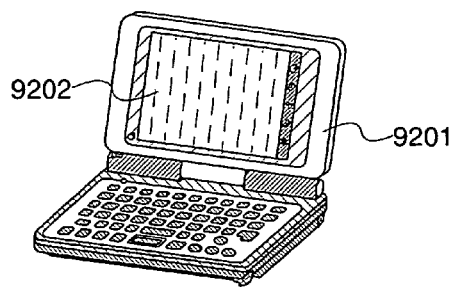
FIGS. 8A to 8F are diagrams showing electronic appliances using display devices according to the invention.
Figure 8B:
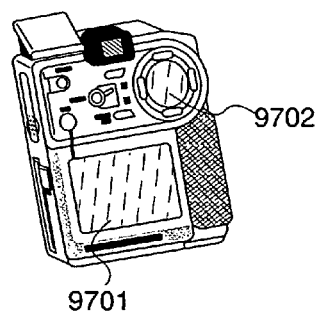
Figure 8C:
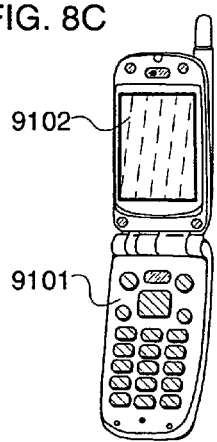
Figure 8D:
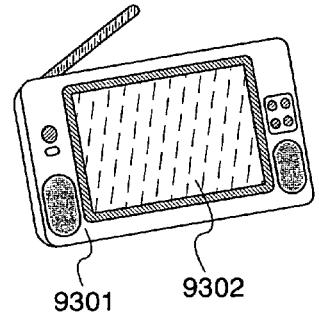
Figure 8F:
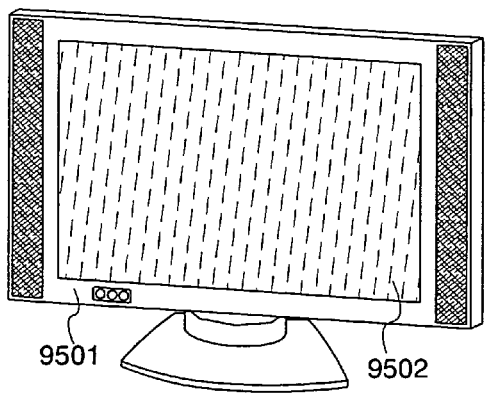
Figure 8E:
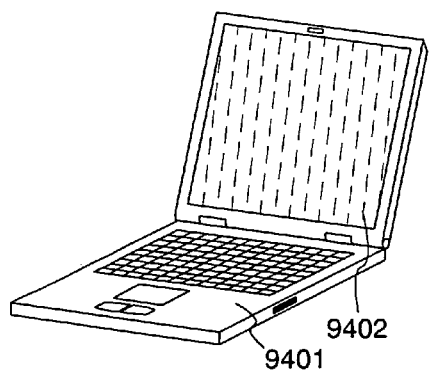

A portable information terminal using a display device according to the invention as shown in FIG. 8A includes a main body 9201, a display portion 9202 and the like. The portable information terminal can display high-definition images according to the invention. A digital video camera using a display device of the invention as shown in FIG. 8B includes display portions 9701, 9702 and the like, and therefore, high-definition images can be displayed. A portable terminal using a display device of the invention as shown in FIG. 8C includes a main body 9101, a display portion 9102 and the like, and higher-definition images can be displayed over the display portion according to the invention. A portable television device using a display device of the invention as shown in FIG. 8D includes a main body 9301, a display portion 9302 and the like and higher-definition images can be displayed over the display portion according to the invention. A portable computer using a display device of the invention as shown in FIG. 8E includes a main body 9401, a display portion 9402 and the like and higher-definition images can be displayed over the display portion according to the invention. A television device using a display device of the invention as shown in FIG. 8F includes a main body 9501, a display portion 9502 and the like and higher-definition images can be displayed over the display portion according to the invention. By arranging a light shielding film, an adverse influence due to stray light can be suppressed, thereby realizing a smaller, lighter, thinner display device. Further, the present embodiment can be freely combined with the above embodiment modes and other embodiments.

[Embodiment 4]

A display device according to the invention can be used as an ID card that can send/receive data by mounting a functional circuit such as a memory and a processing circuit or an antenna coil without contacting to an object. An example of a structure for such the ID card will be described referring to the drawing.

Figure 9A:
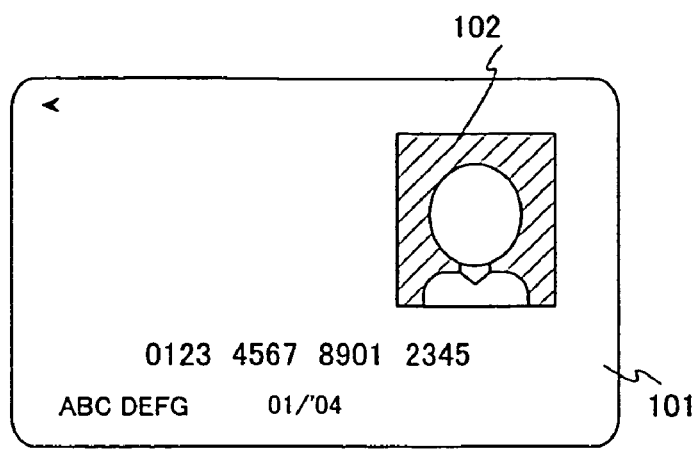
FIGS. 9A and 9B are diagrams showing an ID card using a display device according to the invention.

FIG. 9A illustrates one mode of an ID card with a built-in display device according to the invention. Concretely, the ID card as shown in FIG. 9A is a contactless ID card sending/receiving data to/from a reader/writer of a terminal device without contacting to the terminal device. Reference numeral 101 represents a main body of a card, and reference numeral 102 corresponds to a pixel portion of the display device mounted on the main body 101 of the card.

Figure 9B:
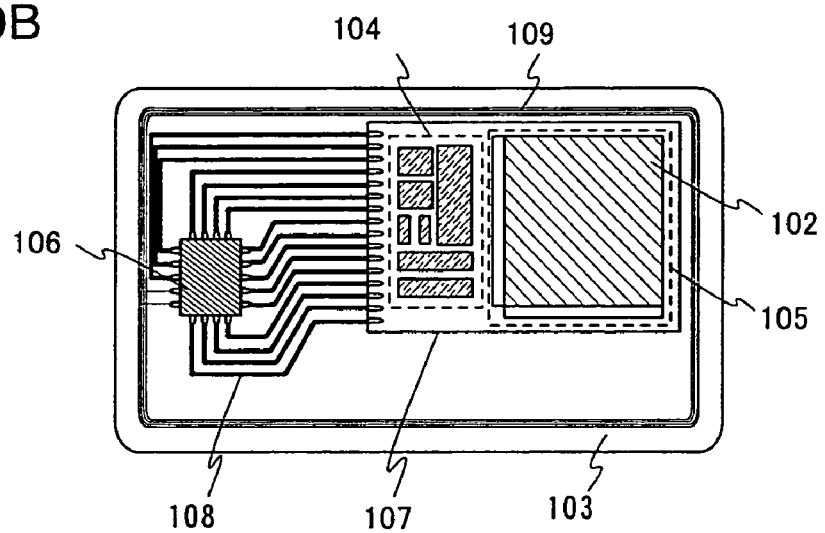

FIG. 9B shows a structure of a card substrate 103 that is included in the main body 101 of the card as shown in FIG. 9A. Over the card substrate 103, the ID chip 104 made from a thin semiconductor film and a display device 105 according to the above embodiment modes or embodiments are attached. The ID chip 104 and the display device 105 are formed over substrates that are separately prepared and then transferred over the card substrate 103. As the transferring method, there are a method in which after manufacturing a thin film integrated circuit including multiple TFTs over a substrate, the integrated circuit is separated from the substrate and then attached to the card substrate by using small vacuum tweezers or the like, a method in which the integrated circuit is selectively attached to the card substrate by using UV irradiation, and the like. Also, a pixel portion or a driver circuit portion of the display device can be transferred in the same manner as the ID chip 104 and the display device 105. A portion formed by using a thin semiconductor film including the ID chip 104 and the display device 105 where is transferred to the card substrate is referred to as a thin film portion 107.

An integrated circuit 106 manufactured using a TFT is mounted on the card substrate 103. A method for mounting the integrated circuit 106 is not particularly limited, and the known COG method, wire bonding method, TAB method or the like can be employed. The integrated circuit 106 is electrically connected to the thin film portion 107 through a wiring 108 formed over the card substrate 103.

Also, an antenna coil 109 electrically connecting to the integrated circuit 106 is formed over the card substrate 103. Sending/receiving data to/from the terminal device by using electromagnetic induction without contacting to the terminal device can be performed by the antenna coil 109. Therefore, the contactless ID card is hardly damaged by physical abrasion, as compared with a contact-type ID card. Further, the contactless ID card can be used as a tag (radio frequency tag) that performs information management without contacting to an object. Additionally, as compared with a contactless bar code capable of reading in information, the contactless ID card has a dramatic large quantity of information that can be managed. Furthermore, the distance between the contactless ID card and an terminal that can read in information can be further increased as compared with the case of using the bar code.

FIG. 9B shows an example in which the antenna coil 109 is formed over the card substrate 103. Alternatively, an antenna coil that is separately prepared may be mounted over the card substrate 103. For example, a copper wire is coiled up. The coiled copper wire is sandwiched between two plastic films each has a thickness of about 100 μm and then pressed to be used as an antenna coil. Alternatively, an antenna coil may be built in a thin film integrated circuit. Although only one antenna coil 109 is used in one ID card as shown in FIG. 9B, a plurality of antenna coils 109 may be used.

FIGS. 9A and 9B show the ID card mounted with the display device 105. By providing the display device 105, data of a head-and-shoulders photo can be displayed on the display device so that the head-and-shoulders photo can be hardly changed into another head-and-shoulders photo for the purpose of forgery as compared with the case of employing the printing. In addition, information other than the head-and-shoulders photo can be displayed thereon, thereby realizing a high-performance ID card.

Further, a flexible plastic substrate can be used as the card substrate 103. The plastic substrate can be made from ARTON (manufactured by JSR Corporation) including norbornene resin with a polar radical. Also, the following materials can be cited as the plastic substrate: polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PBT), polyimide, and the like.

Further, the method for electrically connecting the ID chip to the thin film integrated circuit is not limited to the above-mentioned mode as shown in FIGS. 9A and 9B. For instance, a terminal of the ID chip and a terminal of the thin film integrated circuit may be directly connected to each other by anisotropic conductive resin or solder, rather than connecting to each other through a wiring formed over the card substrate.

In FIGS. 9A and 9B, the thin film integrated circuit and the wiring formed over the card substrate may be connected to each other by the wire bonding method, the flip chip method using solder ball. Alternatively, they may be directly connected to each other by anisotropic conductive resin or solder. Additionally, they are connected to each other by using another method.

Figure 10:
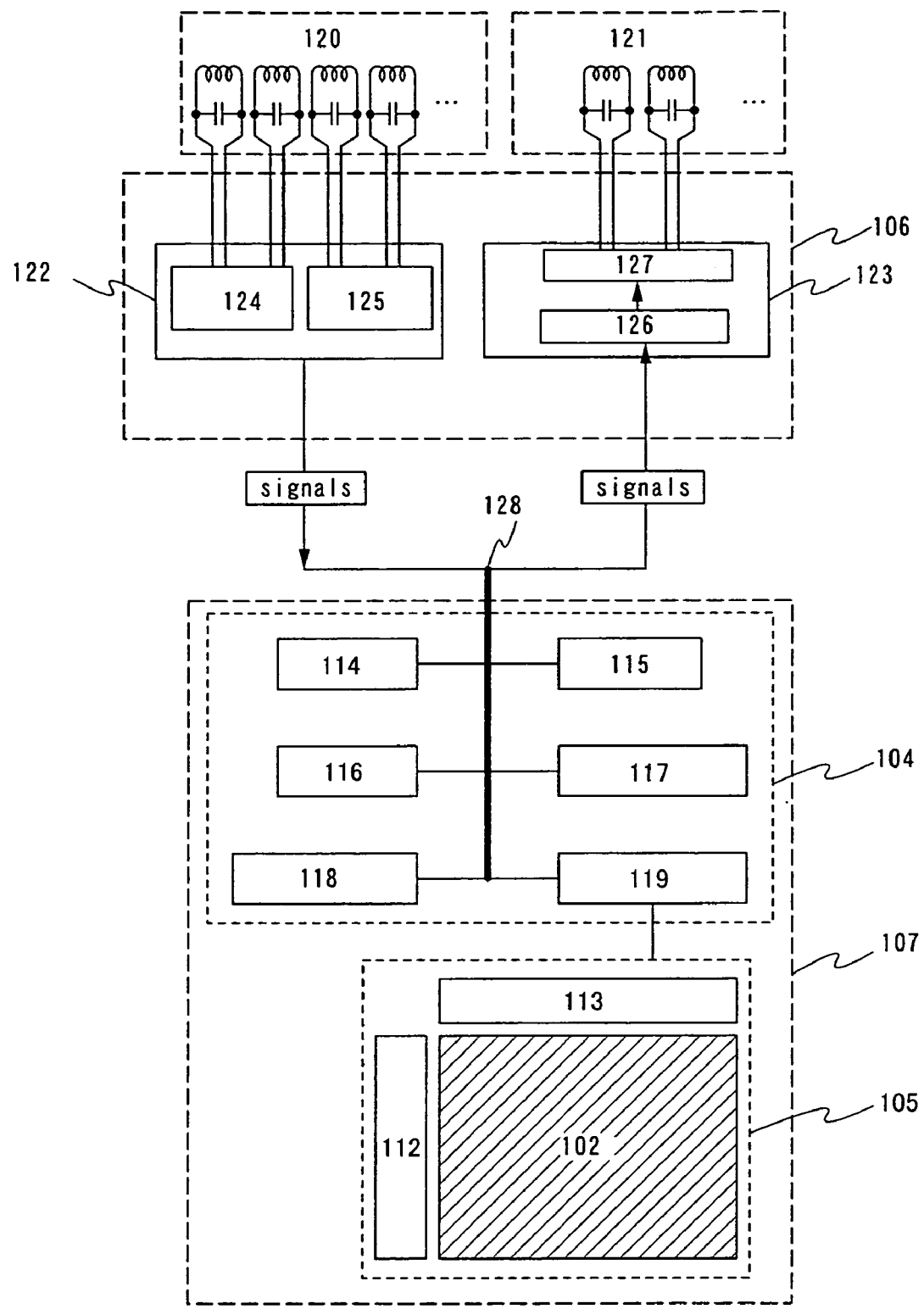
FIG. 10 is a block diagram showing a structure of an ID card using a display device according to the invention.

Next, one mode of a functional structure for an ID chip and a thin film integrated circuit with respect to a contactless ID card will be described. FIG. 10 shows a block diagram of a contactless ID card.

Reference numeral 120 represents an input antenna coil; 121, an output antenna coil; 122, an input interface; and 123, an output interface. Further, the number of various kinds of antenna coils is not limited to the number as illustrated in FIG. 10. The AC (alternating-current) power supply voltage and various kinds of signals input from a terminal device by the input antenna coil 120 are demodulated or converted into the direct current in the input interface 122 and then supplied to various types of circuits such as a CPU 114, a ROM 115, a RAM 116, an EEPROM 117, a coprocessor 118 and a controller 119 through a bus 128. Signals treated or generated in the above various types of circuits are modulated in the output interface 123 and sent to the terminal device by the output antenna coil 121.

Here, the input interface 122 is provided with a rectifier circuit 124 and a demodulation circuit 125. The AC power supply voltage input from the input antenna coil 120 is rectified in the rectifier circuit 124 and then supplied to the above various types of circuits as the DC (direct-current) power supply voltage. Also, various kinds of AC signals input from the input antenna coil 120 are demodulated in the demodulation circuit 125. The demodulated signals are subjected to waveform shaping and then supplied to the various types of circuits.

Further, the output interface 123 is provided with a modulation circuit 126 and an amplifier 127. The various kinds of signals input in the output interface 123 from the various types of circuits are modulated in the modulation circuit 126 and amplified or buffered in the amplifier 127, and then send to the terminal device from the output antenna coil 121.

Further, the various types of circuits as shown in FIG. 10 are just examples, and circuits mounted on an ID card are not limited to the above-mentioned circuits.

In FIG. 10, all treatments of the ID card are controlled by the CPU 114 and various types of programs that are used in the CPU 114 are stored in the ROM 115. The coprocessor 118 is an auxiliary processor helping the operation of the main CPU 114. The RAM 116 serves as a buffer in communication with the terminal device and is used as a work area in data processing. The EEPROM 117 stores data input as signals in a predetermined address. When image data such as a head-and-shoulders photo is stored in a rewritable state, it is stored in the EEPROM 117. When the image data is stored in a non-rewritable state, it is stored in the ROM 115. Alternatively, a memory for storing the image date may separately be prepared.

In the controller 119, a signal including image data is subjected to data processing in accordance with the specification of the display device 105 and then supplied to the display device 105 as a video signal. Also, the controller 119 generates a Hsync signal, a Vsync signal, a clock signal (CLK), an alternating-current voltage (AC cont) and the like based on the power supply voltage and various kinds of signals input from the input interface 122. These signals are supplied to the display device 105.

In the display device 105, a pixel portion 102 in which a light emitting element is provided in each pixel, a scanning line driver circuit 112 for selecting a pixel provided in the pixel portion 102, and a signal line driver circuit 113 for supplying a video signal to the selected pixel are provided.

Although an example of forming the contactless ID card by using the antenna coils is shown in FIG. 10, a contactless ID card is not limited thereto. A contactless ID card may be formed by using a light emitting element, a light sensor or the like such that data is sent/received by light.

In FIG. 10, the input interface 122 and the output interface 123 including analog circuits such as the rectifier circuit 124, the demodulation circuit 125 and the modulation circuit 126 are formed in the integrated circuit 106. Also, the various types of circuits such as the CPU 114, the ROM 115, the RAM 116, the EEPROM 117, the coprocessor 118 and the controller 119 are formed by using an ID chip 104. However, this configuration is an example, and the present invention is not limited to this configuration. For example, a function such as a GPS may be provided. In addition, although the integrated circuit 106 is formed over a silicon wafer as well as the conventional manner, it may be formed over a thin film integrated circuit using a TFT as well as the ID chip 104.

FIG. 10 shows an example in which a power supply voltage is supplied from the reader/writer of the terminal device; however, the present invention is not limited thereto. For example, a solar buttery, an ultra thin buttery such as a lithium battery or the like may be built in the ID card. Although the contactless ID card is explained as an example in this embodiment, a display device according to the present invention can be mounted on a contact-type ID card in which a connection terminal provided in the ID card and a reader/writer of a terminal device are electrically connected to send/receive data.

The ID card having the above configuration can be used as a driver's license, an identification, and the like. When a head-and-shoulders photo is transferred to an ID card by printing, the head-and-shoulders photo is relatively easily changed for the purpose of forgery. However, in the case of using the ID card according to the present invention, a head-and-shoulders photo is not easily changed. Therefore, the ID card according to the present invention can prevent forgery to ensure security and display images other than a head-and-shoulders photo so that the added value is heightened and the multifunctionality can be realized. Furthermore, the present embodiment can be freely combined with the above embodiment modes and other embodiments.

[Embodiment 5]

Figure 11A:
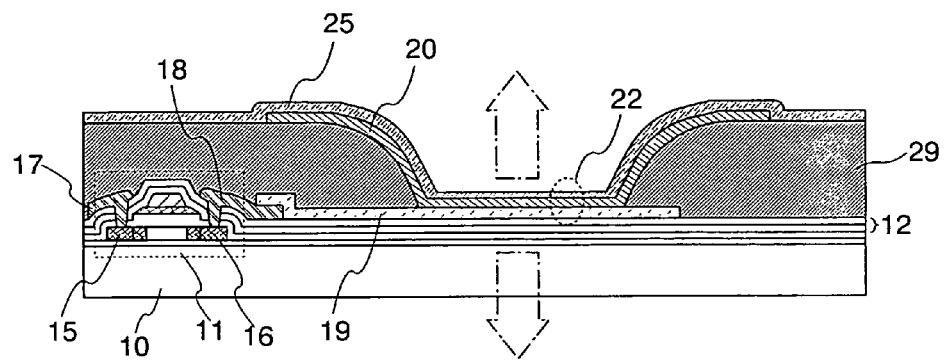
FIGS. 11A and 11B are cross sectional views explaining structures of dual emission type display devices according to the invention.

A display device having a different structure from those of the above mentioned embodiment modes will be described in the present embodiment. A display device as shown in FIG. 11A comprises: a first insulating film 12 formed on a transistor 11 that is formed over a substrate 10; a pixel electrode 19 provided on the first insulating film 12; a partition wall layer 29 provided in contact with the pixel electrode 19; an electroluminescent layer 20 provided in contact with the pixel electrode 19 and the partition wall layer 29; and a counter electrode 25 provided in contact with the electroluminescent layer 20.

Openings are formed in the first insulating film and a gate insulating film of the transistor and source/drain wirings 17 and 18 are formed therein. Accordingly, the transistor 11 and the pixel electrode 19 are connected to each other. Preferably, the source/drain wirings 17 and 18 are made from alloy containing aluminum and carbon. Also, the alloy may contain nickel, cobalt, iron, silicon, and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon. Also, the pixel electrode 19 is formed in contact with the source/drain wiring 18.

The first insulating film is formed to have a two-layer structure including silicon nitride, silicon oxide, silicon nitride oxide, silicon oxynitride, and the like. However, the present invention is not limited to this two-layer structure. Further, the first insulating film can be omitted.

A light shielding film is used as the partition wall layer 29 here. As a light shielding film used for the partition wall layer 29, an organic material such as acrylic, polyimide and siloxane that is mixed with carbon or a metal particle with a light shielding property can be used. Of course, partition wall layers with light transmitting properties may be additionally provided on and under the partition wall layer 29. The materials as mentioned in the above embodiment modes can arbitrarily be used for another constituent elements. In particular, when the counter electrode 25 is made from a thin aluminum film with a thickness of 1 to 10 nm, an aluminum film containing minute amounts of Li or the like so as to transmit light from a light emitting layer, a dual emission type display device as shown in FIG. 11A can be achieved. Of course, a bottom emission type display device can also be formed by changing the materials of the counter electrode 25.

Figure 11B:
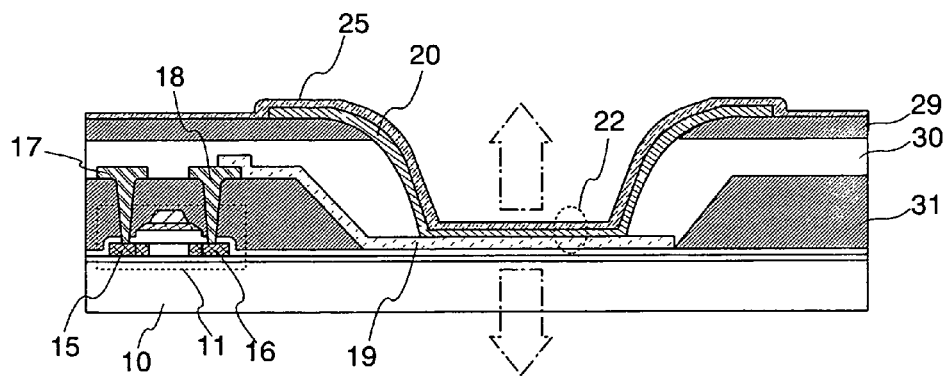

Next, a display device having a structure as shown in FIG. 11B comprises a transistor 11 provided over a substrate 10; an insulating film 31 with a light shielding property provided on the transistor 11; an opening provided in the insulating film 31 with the light shielding property; and a light emitting element 22 provided inside of the opening.

In the structure as shown in FIG. 11B, an insulating film made from an inorganic material (i.e., a barrier film) is not provided on the transistor 11. Of curse, the barrier film may be provided thereon. Openings are formed in the first insulating film and a gate insulating film of the transistor and source/drain wirings 17 and 18 are provided therein. Accordingly, the transistor 11 and the pixel electrode 19 are connected to each other. The source/drain wirings 17 and 18 are preferably made from alloy containing aluminum and carbon. In addition, the alloy may contain nickel, cobalt, iron, silicon and the like. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon.

As the insulating film 31 with the light shielding property, an organic material such as acrylic, polyimide and siloxane that mixed with carbon or a metal particle with a light shielding property can be used. An opening is formed in the insulating film 31 such that light can pass therethrough. In FIG. 11B, the pixel electrode 19 is formed to cover the gate insulating film which is exposed. Further, a partition wall layer 30 is formed on the pixel electrode, and a partition wall layer 29 is formed on the partition wall layer 30. In this structure, the partition wall layer 29 has a light shielding property and the partition wall layer 30 is transparent; however, the present invention is not limited to this structure. An electroluminescent layer 20 and a counter electrode 25 are formed in an opening provided in the both partition wall layers so that the light emitting element 22 is formed.

The counter electrode 25 is made from a thin aluminum film with a thickness of 1 to 10 nm, an aluminum film containing minute amounts of Li, or the like so as to transmit light from the light emitting layer, thereby obtaining a dual emission type display device as shown in FIG. 11B. Of course, a bottom emission type display device can be fabricated by changing the materials of the counter electrode 25.

An insulating film with a light shielding property or an insulating film with a light transmitting property is not necessary to be provided under the pixel electrode 19 in the display devices as shown in FIGS. 11A and 11B so that steps can be simplified. Meanwhile, when a partition wall layer 29 including a film with a light shielding property is at least used, an adverse influence of an indistinct outline between pixels due to stray light can be suppressed in the case of top emission. That is, since the insulating film with the light shielding property absorbs the stray light, the outline between the pixels is clearly defined so that high-definition images can be displayed. Further, the arrangement of the light shielding film can suppress the adverse influence due to stray light, thereby realizing a smaller, lighter, thinner display device. Furthermore, the present embodiment can be freely combined with the above embodiment modes and other embodiments.

[Embodiment 6]

A structure in the case where a color filter is provided in each pixel portion will be described in the present embodiment referring to FIGS. 12A and 12B. In a bottom emission type display device as shown in FIG. 12A, color filters 90 to 92 of R, G and B are provided over a substrate 10, respectively. An organic resin layer 95 such as acrylic is formed to planarize the surfaces of the color filters and a transistor 11, a light emitting element 22 and the like are formed thereover. The color filters 90 to 92 are made from a known material by using a known method.

In a dual emission type display device as shown in FIG. 12B, a transistor 11 is formed over a substrate 10 and an insulating film 31 with a light shielding property is formed. After providing an opening for transmitting light from a light emitting layer, resin with a light transmitting property containing pigments of red, green and blue is formed in the opening so that cooler filters 93 to 95 are formed. Preferably, the resin containing these pigments is selectively formed by the droplet discharging method. In addition, the color filters 90 to 92 of R, G and B are provided over a counter substrate 406 as well as FIG. 12A, and the counter substrate 406 is attached to the substrate 10 over which the transistor 11, the light emitting element 22 and the like are provided through the organic resin layer 95 such as acrylic.

Further, in FIG. 12A, transparent resin containing pigments may be formed in the opening of the insulating film 31 with the light shielding property to form color filters as well as FIG. 12B.

Generally, when forming a color filter, a black matrix (a grid-like or strip-like light shielding film for optically separating respective pixels of R, G and B) is provided around the color filter. However, the insulating film 31 with the light shielding property is formed corresponding to portions to be provided with the black matrix in FIGS. 12A and 12B. Accordingly, present invention does not have to take into account the displacement of mask which is used in forming the black matrix, yield is improved. In addition, an excess step is not necessary to be added, thereby reducing cost. Furthermore, this embodiment can be freely combined with the above embodiment modes and other embodiments.

[Embodiment 7]

The present embodiment will describe a lamination structure of source/drain wirings 17 and 18 (including a connection wiring 24, hereinafter referred to as wirings) and a pixel electrode 19 with reference to FIGS. 14A to 14D. Each of FIGS. 14A to 14D only shows a half of a light emitting element in a pixel region.

Figure 14A:
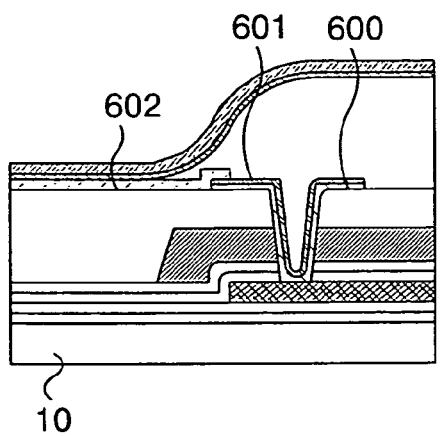
FIGS. 14A to 14D are schematic views in a case of laminating a source/drain wiring and a connection wiring.

FIG. 14A illustrates a lamination structure of Mo 600 and aluminum-based alloy 601 as a wiring and ITO 602 as a pixel electrode 19. As the aluminum-based alloy 601, aluminum mixed with carbon, nickel, cobalt, iron, silicon and the like is preferably used. For example, the alloy may contains 0.1 to 3.0 atomic % of carbon, 0.5 to 7.0 atomic % of at least one or more of elements selected from nickel, cobalt and iron, and 0.5 to 2.0 atomic % of silicon. The resultant material has a feature of a low electric resistance value of 3.0 to 5.0 Ωcm. Further, the Mo 600 serves as barrier metal.

When the aluminum-based alloy 601 contains 0.5% or more of at least one or more elements selected from nickel, cobalt and iron, the electrode potential of the aluminum-based alloy can reach that of the ITO 602 so that they can be directly connected to each other. In addition, the heat resistance property of the aluminum-based alloy 601 can be increased. Alternatively, when the aluminum-based alloy 601 contains 0.1% or more of carbon, heroic generation can be suppressed. When the aluminum-based alloy contains silicon, there is a merit that the heroic is hardly caused even in the case of performing a heat treatment at a high temperature.

Figure 14B:
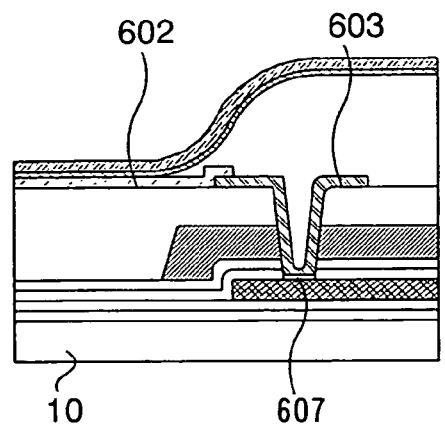

FIG. 14B shows a case of using aluminum-based alloy 603 as a wiring and ITO 602 as a pixel electrode 19. The aluminum-based alloy 603contains at least nickel here. After forming the aluminum-based alloy 603, the nickel contained in the alloy seeps and chemically reacts with Si contained in a silicon semiconductor layer of the transistor 11 so that nickel silicide 607 is formed. This has a merit of increasing the adhesiveness.

Figure 14C:
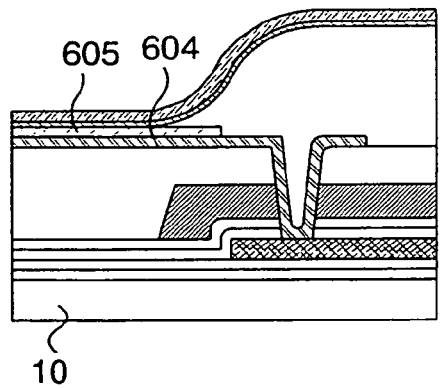

FIG. 14C shows a case of laminating aluminum-based alloy 604 as a wiring and ITO 605 as a pixel electrode 19. In particular, when employing the above-mentioned lamination structure, it was experimentally known that the planarity is extremely improved. For example, the planarity thereof exhibits about two times as preferable as a structure formed by sequentially laminating Al—Si alloy, a wiring made from TiN and ITO over a substrate or a structure formed by sequentially laminating Al—Si alloy, a wiring made from TiN and ITSO.

Figure 14D:
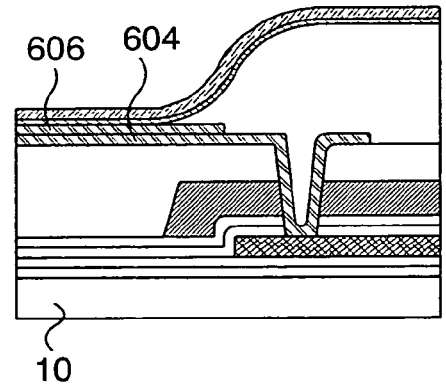

FIG. 14D shows a case of using aluminum-based alloy 604 and 606 as a wiring and a pixel electrode, respectively.

Since the above-mentioned aluminum-based alloy can be easily patterned by wet etching, its application range is wide without regard to a wiring and a pixel electrode. Further, since the aluminum-based alloy is superior in reflexivity, when forming a bottom emission type or dual emission type display device, the aluminum film is necessary to be formed to be a thin film such that light can pass through the wiring or the pixel electrode. Furthermore, the present embodiment can be freely combined with the embodiment modes and other embodiments.

Since an insulating film with a light shielding property is provided in each of the bottom emission type, top emission type and dual emission type display devices according to the invention, an adverse influence of an indistinct outline of a light emitting region corresponding to one pixel due to stray light can be suppressed. That is, since the insulating film with the light shielding property absorbs the stray light, the outline of the light emitting region corresponding to one pixel is clearly defined, thereby displaying high-definition images. In addition, the arrangement of a light shielding film can suppress the adverse influence due to stray light so that a smaller, lighter, thinner display device can be realized. The display devices according to the invention having such superior effects can be mounted on various types of electronic appliances such as a television device (e.g., a television and a television receiver), a digital camera, a digital video camera, a portable telephone device (e.g., cellular phone), a portable information terminal like a PDA etc., a portable game machine, a monitor, a computer, an audio reproduction device like a car audio system etc., and an image reproduction device equipped with a recording medium (e.g., a domestic game machine). In addition, the display devices according to the present invention can be further mounted on a tool which is essential to set up of a ubiquitous network like an ID card. As a consequence, it is believed that the display devices according to the invention have the widespread application range and the utility value. The present application is based on Japanese Priority Application No. 2004-134753 filed on Apr. 28, 2004 with the Japanese Patent Office, the entire contents of which are hereby incorporated by reference.

What is claimed is:

1. A display device comprising:
   a transistor formed over a substrate;
   an insulating film with a light shielding property formed over the transistor;
   an opening for transmitting light therethrough provided in the insulating film with the light shielding property;
   an electrode over the opening, the electrode being electrically connected to the transistor; and
   a light emitting layer that at least partially overlaps with the opening,
   wherein the electrode is a pixel electrode with a light transmitting property,
   wherein the light emitting layer is an electroluminescent layer,
   wherein a light emitting element includes the pixel electrode, the electroluminescent layer and a counter electrode,
   wherein a partition wall layer including a film with a light shielding property is provided in contact with at least one of the pixel electrode, the electroluminescent layer and the counter electrode, and
   wherein the insulating film with the light shielding property covers the transistor.

2. The display device according to claim 1, wherein the transistor and the pixel electrode are connected to each other by a wiring made from an alloy containing aluminum and nickel.

3. The display device according to claim 2, wherein the alloy contains carbon.

4. The display device according to claim 1, wherein the insulating film with the light shielding property contains carbon.

5. A display device comprising:
a transistor formed over a substrate;
a first insulating film with a light shielding property formed over the transistor;
an opening for transmitting light therethrough provided in the first insulating film;
a second insulating film formed over and in contact with the first insulating film;
an electrode over the second insulating film, the electrode being electrically connected to the transistor;
a light emitting layer formed over the electrode; and
a partition wall layer including a film with a light shielding property,
wherein the electrode is a pixel electrode with a light transmitting property,
wherein the light emitting layer is an electroluminescent layer,
wherein a light emitting element includes the pixel electrode, the electroluminescent layer and a counter electrode,
wherein the partition wall layer is provided in contact with at least one of the pixel electrode, the electroluminescent layer and the counter electrode,
wherein the first insulating film with the light shielding property covers the transistor, and
wherein the second insulating film is formed in the opening.

6. The display device according to claim 5, wherein the transistor and the pixel electrode are connected to each other by a wiring made from an alloy containing aluminum and nickel.

7. The display device according to claim 6, wherein the alloy contains carbon.

8. The display device according to claim 5, wherein the first insulating film with the light shielding property contains carbon.

9. The display device according to claim 5, wherein the second insulating film contains polyimide, acrylic or siloxane.

10. A display device comprising:
a transistor formed over a substrate;
a first insulating film formed over the transistor;
a second insulating film with a light shielding property provided on the first insulating film;
an opening for transmitting light therethrough provided in the second insulating film;
a third insulating film formed over and in contact with the second insulating film;
an electrode over the third insulating film, the electrode being electrically connected to the transistor; and
a light emitting layer formed over the electrode,
wherein the electrode is a pixel electrode with a light transmitting property,
wherein the light emitting layer is an electroluminescent layer,
wherein a light emitting element includes the pixel electrode, the electroluminescent layer and a counter electrode,
wherein a partition wall layer including a film with a light shielding property is provided in contact with at least one of the pixel electrode, the electroluminescent layer and the counter electrode,
wherein the second insulating film with the light shielding property covers the transistor, and
wherein the third insulating film is formed in the opening.

11. The display device according to claim 10, wherein the transistor and the pixel electrode are connected to each other by a wiring made from an alloy containing aluminum and nickel.

12. The display device according to claim 11, wherein the alloy contains carbon.

13. The display device according to claim 10, wherein the first insulating film contains silicon nitride, silicon oxide, silicon nitride oxide or silicon oxide nitride.

14. The display device according to claim 10, wherein the second insulating film with the light shielding property contains carbon.

15. The display device according to claim 10, wherein the third insulating film contains polyimide, acrylic or siloxane.

16. A display device comprising:
a transistor formed over a substrate;
a first insulating film with a light shielding property formed over the transistor;
an opening for transmitting light therethrough provided in the first insulating film;
a second insulating film with a light transmitting property and containing a pigment formed in the opening;
an electrode over the second insulating film, the electrode being electrically connected to the transistor; and
a light emitting layer formed over the electrode,
wherein the electrode is a pixel electrode with a light transmitting property,
wherein the light emitting layer is an electroluminescent layer,
wherein a light emitting element includes the pixel electrode, the electroluminescent layer and a counter electrode,
wherein a partition wall layer including a film with a light shielding property is provided in contact with at least one of the pixel electrode, the electroluminescent layer and the counter electrode, and
wherein the first insulating film with the light shielding property covers the transistor.

17. The display device according to claim 16, wherein the transistor and the pixel electrode are connected to each other by a wiring made from an alloy containing aluminum and nickel.

18. The display device according to claim 17, wherein the alloy contains carbon.

19. The display device according to claim 16, wherein the first insulating film with the light shielding property contains carbon.

20. The display device according to claim 16, wherein the pigment exhibits a red, green or blue color.

21. A display device comprising:
a transistor formed over a substrate;
an insulating film with a light shielding property formed over the transistor;
an opening for transmitting light therethrough provided in the insulating film with the light shielding property;
an electrode over the opening, the electrode being electrically connected to the transistor; and
a light emitting layer that at least partially overlaps with the opening, wherein the electrode is a pixel electrode with a light transmitting property, wherein the light emitting layer is an electroluminescent layer, wherein a light emitting element includes the pixel electrode, the electroluminescent layer and a counter electrode, wherein a partition wall layer including a film with a light shielding property is provided in contact with at least one of the pixel electrode, the electroluminescent layer and the counter electrode, wherein at least a portion of the light emitting element is located inside the opening of the insulating film with the light shielding property, and wherein the insulating film with the light shielding property covers the transistor.

22. The display device according to claim 21, wherein the transistor and the pixel electrode are connected to each other by a wiring made from an alloy containing aluminum and nickel.

23. The display device according to claim 22, wherein the alloy contains carbon.

24. The display device according to claim 21, wherein the insulating film with the light shielding property contains carbon.

* * * * *